(12) United States Patent
Shishida et al.

(10) Patent No.: US 8,022,497 B2
(45) Date of Patent: Sep. 20, 2011

(54) SEMICONDUCTOR DEVICE COMPRISING INSULATING FILM

(75) Inventors: Yoshinori Shishida, Gifu (JP); Shinichi Chikaki, Tokyo (JP); Ryotaro Yagi, Shizuoka (JP)

(73) Assignees: Sanyo Electric Co., Ltd., Osaka (JP); NEC Corporation, Tokyo (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/711,764

(22) Filed: Feb. 28, 2007

(65) Prior Publication Data
US 2007/0205484 A1 Sep. 6, 2007

(30) Foreign Application Priority Data
Feb. 28, 2006 (JP) ................................. 2006-051818

(51) Int. Cl.
*H01L 23/522* (2006.01)
*H01L 23/532* (2006.01)
*H01L 29/40* (2006.01)
*H01L 23/52* (2006.01)
*B32B 7/02* (2006.01)
*B32B 9/04* (2006.01)

(52) U.S. Cl. ......... 257/499; 257/E23.019; 257/E21.579; 257/758; 257/774; 257/773; 257/750; 257/635; 257/775

(58) Field of Classification Search ............... 257/499, 257/E23.019, 758, 774, 773, 750, E21.24, 257/635, 775, E21.795
See application file for complete search history.

(56) References Cited

U.S. PATENT DOCUMENTS

| | | | | |
|---|---|---|---|---|
| 6,051,882 | A * | 4/2000 | Avanzino et al. | 257/760 |
| 6,805,139 | B1 * | 10/2004 | Savas et al. | 134/1.3 |
| 6,958,542 | B2 * | 10/2005 | Hasunuma et al. | 257/758 |
| 7,253,105 | B2 * | 8/2007 | Dimitrakopoulos et al. | 438/674 |
| 7,307,344 | B2 * | 12/2007 | Minamihaba et al. | 257/758 |
| 7,459,391 | B2 * | 12/2008 | Yoshizawa et al. | 438/638 |
| 2005/0170633 | A1 | 8/2005 | Sasaki et al. | |
| 2005/0287790 | A1 * | 12/2005 | Owada et al. | 438/622 |
| 2006/0121721 | A1 * | 6/2006 | Lee et al. | 438/618 |
| 2006/0192286 | A1 * | 8/2006 | Kanamura | 257/758 |
| 2006/0261483 | A1 * | 11/2006 | Tsumura et al. | 257/758 |

(Continued)

FOREIGN PATENT DOCUMENTS
JP 2005-272188 A 10/2005

OTHER PUBLICATIONS

R. Yagi et al. "Control of Process-Induced Damages in Self-Assembled Porous Silica/Cu Damascene Interconnects for 45nm Node and Beyond", Symposium on VLSI Technology Digest of Technical Papers, 2005, p. 146-147.

(Continued)

*Primary Examiner* — A Williams
(74) *Attorney, Agent, or Firm* — McDermott Will & Emery LLP

(57) ABSTRACT

A semiconductor device capable of preventing an interlayer dielectric film from deterioration resulting from a liquid such as a chemical solution penetrating into the interlayer dielectric film and recovering the interlayer dielectric film from deterioration with a prescribed gas is obtained. This semiconductor device comprises a first insulating film formed on a substrate and a first gas-liquid separation film, formed on at least a part of the surface of the first insulating film, composed of a material hardly permeable by a liquid and easily permeable by a gas.

14 Claims, 17 Drawing Sheets

U.S. PATENT DOCUMENTS

| | | | |
|---|---|---|---|
| 2007/0013069 A1* | 1/2007 | Tada et al. | 257/758 |
| 2007/0037374 A1* | 2/2007 | Hayashi et al. | 438/597 |
| 2007/0186953 A1* | 8/2007 | Savas et al. | 134/1.3 |
| 2007/0202699 A1* | 8/2007 | Toyoda et al. | 438/687 |
| 2008/0122102 A1* | 5/2008 | Sakata et al. | 257/763 |
| 2008/0171441 A1* | 7/2008 | Takemiya | 438/693 |
| 2008/0318417 A1* | 12/2008 | Shinriki et al. | 438/650 |
| 2010/0151675 A1* | 6/2010 | Tada et al. | 438/637 |
| 2010/0207274 A1* | 8/2010 | Hayashi et al. | 257/751 |

OTHER PUBLICATIONS

Chinese Office Action, w/ English translation thereof, issued in Chinese Patent Application No. CN 200710084220.7 dated Dec. 4, 2009.

* cited by examiner

US 8,022,497 B2

SEMICONDUCTOR DEVICE COMPRISING INSULATING FILM

BACKGROUND OF THE INVENTION

1. Field of the Invention

The present invention relates to a semiconductor device and a method of fabricating the same, and more particularly, it relates to a semiconductor device comprising an interlayer dielectric film and a method of fabricating the same.

2. Description of the Background Art

A porous interlayer dielectric film is generally known as a film isolating conductive layers of a semiconductor device from each other, as disclosed in Japanese Patent Laying-Open No. 2005-272188, for example. In the semiconductor device employing the porous interlayer dielectric film disclosed in the aforementioned Japanese Patent Laying-Open No. 2005-272188, the dielectric constant of the interlayer dielectric film can be so reduced as to reduce a parasitic capacitance between wires.

A structure of a semiconductor device having an $SiO_2$ or SiN film formed on an interlayer dielectric film is also known in general. When a wiring layer is formed on the interlayer dielectric film and the surface thereof is flattened by partially polishing the wiring layer by CMP (chemical mechanical polishing), the $SiO_2$ or SiN film formed on the interlayer dielectric film functions as a CMP stopper.

In the conventional semiconductor device employing the porous interlayer dielectric film, however, a large quantity of hydrophobic groups such as methyl groups disappear from the interlayer dielectric film when a wet process using a liquid such as a chemical solution or a plasma process is employed in any step of preparing the semiconductor device, to disadvantageously increase hygroscopicity of the interlayer dielectric film. Consequently, the liquid such as a chemical solution easily penetrates into the interlayer dielectric film, to disadvantageously deteriorate the interlayer dielectric film.

When the interlayer dielectric film of the conventional semiconductor device having the $SiO_2$ (SiN) film formed thereon is exposed to a prescribed gas atmosphere for recovering the interlayer dielectric film from deterioration, on the other hand, the $SiO_2$ (SiN) film disadvantageously inhibits the prescribed gas from penetrating into the interlayer dielectric film. Consequently, it is difficult to recover the interlayer dielectric film from deterioration with the prescribed gas.

SUMMARY OF THE INVENTION

The present invention has been proposed in order to solve the aforementioned problems, and an object of the present invention is to provide a semiconductor device capable of preventing an interlayer dielectric film from deterioration resulting from a liquid such as a chemical solution penetrating into the interlayer dielectric film and recovering the interlayer dielectric film from deterioration with a prescribed gas.

Another object of the present invention is to provide a method of fabricating a semiconductor device capable of preventing an interlayer dielectric film from deterioration resulting from a liquid such as a chemical solution penetrating into the interlayer dielectric film and recovering the interlayer dielectric film from deterioration with a prescribed gas.

In order to attain the aforementioned objects, a semiconductor device according to a first aspect of the present invention comprises a first insulating film formed on a substrate and a first gas-liquid separation film, formed on at least a part of the surface of the first insulating film, composed of a material hardly permeable by a liquid and easily permeable by a gas.

In the semiconductor device according to the first aspect, as hereinabove described, the first gas-liquid separation film of the material hardly permeable by a liquid and easily permeable by a gas is so formed on at least a part of the surface of the first insulating film that the same can inhibit a liquid from penetrating into the first insulating film and can be inhibited from blocking penetration of a gas into the first insulating film. When a wet process using a liquid such as a chemical solution is employed in any step of preparing the semiconductor device, therefore, the first gas-liquid separation film can inhibit the liquid such as a chemical solution from penetrating into the first insulating film. Consequently, the first insulating film can be prevented from deterioration resulting from the liquid such as a chemical solution penetrating into the same. When a plasma process is employed in another step of preparing the semiconductor device and the first insulating film is damaged by high-energy radical contained in plasma, on the other hand, a prescribed gas for recovering the first insulating film from deterioration can be introduced into the first insulating film through the first gas-liquid separation film. Consequently, the first insulating film can be recovered from deterioration with the prescribed gas.

The aforementioned semiconductor device according to the first aspect preferably further comprises a wiring layer formed on at least the part of the surface of the first insulating film. According to this structure, the first gas-liquid separation film can inhibit a liquid such as a plating solution from penetrating into the first insulating film when the wiring layer is formed by plating. Consequently, the first insulating film can be prevented from deterioration resulting from the liquid such as a plating solution penetrating into the first insulating film when the wiring layer is formed by plating.

In the aforementioned structure further comprising the wiring layer, the first insulating film preferably has a first opening for communicating with the part of the surface of the substrate, the first gas-liquid separation film is preferably formed at least either on the inner surface of the first opening of the first insulating film or on the upper surface of the first insulating film opposite to the substrate, and the wiring layer is preferably formed inside the first opening of the first insulating film. According to this structure, the liquid such as a chemical solution can be inhibited from penetrating into the first insulating film at least either through the inner surface of the first opening of the first insulating film or through the upper surface of the first insulating film opposite to the substrate in the semiconductor device having the wiring layer formed inside the first opening of the first insulating film. Further, a prescribed gas for recovering the first insulating film from deterioration can be introduced into the first insulating film at least either through the inner surface of the first opening of the first insulating film or through the upper surface of the first insulating film opposite to the substrate. Thus, the first insulating film can be easily prevented from deterioration resulting from the liquid such as a chemical solution penetrating into the same and easily recovered from deterioration with the prescribed gas in the semiconductor device having the wiring layer formed inside the first opening of the first insulating film.

In this case, the first gas-liquid separation film is preferably formed on both of the inner surface of the first opening of the first insulating film and the upper surface of the first insulating film opposite to the substrate. According to this structure, the liquid such as a chemical solution can be inhibited from penetrating into the first insulating film through both of the inner surface of the first opening of the first insulating film and the upper surface of the first insulating film opposite to the substrate. Thus, the first insulating film can be further prevented from deterioration resulting from the liquid such as a chemical solution penetrating into the same. Further, the first gas-liquid separation film is so formed on both of the inner surface of the first opening of the first insulating film and the upper surface of the first insulating film opposite to the substrate that the prescribed gas for recovering the first insulating film from deterioration can be introduced into the first insulating film through both of the inner surface of the first opening of the first insulating film and the upper surface of the first insulating film opposite to the substrate. Thus, the quantity of the prescribed gas penetrating into the first insulating film can be so increased that the first insulating film can be recovered from deterioration in a short time and the rate of recovering the first insulating film from deterioration can be improved.

In the aforementioned semiconductor device provided with the first insulating film having the first opening, the first gas-liquid separation film is preferably formed not on the inner surface of the first opening of the first insulating film but on the upper surface of the first insulating film opposite to the substrate. According to this structure, the liquid such as a chemical solution can be inhibited from penetrating into the first insulating film through the upper surface of the first insulating film opposite to the substrate. Further, the prescribed gas for recovering the first insulating film from deterioration can be introduced into the first insulating film through the upper surface of the first insulating film opposite to the substrate. Thus, the first insulating film can be easily prevented from deterioration resulting from the liquid such as a chemical solution penetrating into the same and easily recovered from deterioration with the prescribed gas.

In the aforementioned semiconductor device provided with the first insulating film having the first opening, the first gas-liquid separation film is preferably formed not on the upper surface of the first insulating film opposite to the substrate but on the inner surface of the first opening of the first insulating film. According to this structure, the liquid such as a chemical solution can be inhibited from penetrating into the first insulating film through the inner surface of the first opening of the first insulating film. Further, the prescribed gas for recovering the first insulating film from deterioration can be introduced into the first insulating film through the inner surface of the first opening of the first insulating film. Thus, the first insulating film can be easily prevented from deterioration resulting from the liquid such as a chemical solution penetrating into the same and easily recovered from deterioration with the prescribed gas.

The aforementioned semiconductor device provided with the first insulating film having the first opening preferably further comprises a barrier metal layer arranged between the wiring layer and the substrate. According to this structure, the barrier metal layer can inhibit the wiring layer from diffusing into the substrate.

The aforementioned semiconductor device provided with the first insulating film having the first opening preferably further comprises a second insulating film formed on the first insulating film and a second gas-liquid separation film, formed on at least a part of the surface of the second insulating film, composed of a material hardly permeable by a liquid and easily permeable by a gas, while the second insulating film preferably has a second opening connected to the first opening of the first insulating film, the first gas-liquid separation film and the second gas-liquid separation film are preferably formed at least either on the inner surfaces of the first and second openings or on the upper surfaces of the first and second insulating films opposite to the substrate, and the wiring layer is preferably formed inside the first and second openings. According to this structure, the semiconductor device can be provided in a two-layer structure capable of preventing interlayer dielectric films from deterioration and recovering the same from deterioration.

In this case, the first gas-liquid separation film and the second gas-liquid separation film are preferably formed on both of the inner surfaces of the first and second openings and the upper surfaces of the first and second insulating films opposite to the substrate. According to this structure, the liquid such as a chemical solution can be inhibited from penetrating into the first and second insulating films through both of the inner surfaces of the first and second openings and the upper surfaces of the first and second insulating films opposite to the substrate. Thus, the first and second insulating films can be further prevented from deterioration resulting from the liquid such as a chemical solution penetrating into the same. Further, the first and second gas-liquid separation films are so formed on both of the inner surfaces of the first and second openings and the upper surfaces of the first and second insulating films opposite to the substrate that a prescribed gas for recovering the first and second insulating films from deterioration can be introduced into the first and second insulating films through both of the inner surfaces of the first and second openings and the upper surfaces of the first and second insulating films opposite to the substrate. Thus, the quantity of the prescribed gas penetrating into the first and second insulating films can be so increased that the first and second insulating films can be recovered from deterioration in a short time and the rate of recovering the first and second insulating films from deterioration can be improved.

In the aforementioned semiconductor device according to the first aspect, the first gas-liquid separation film preferably includes a gas-liquid separation film composed of SiOC. According to this structure, the first gas-liquid separation film composed of SiOC hardly permeable by a liquid and easily permeable by a gas can easily inhibit the liquid from penetrating into the first insulating film and can be easily inhibited from blocking penetration of the gas into the first insulating film.

In this case, the first gas-liquid separation film preferably has a thickness of at least 5 nm and not more than 15 nm. The thickness of the first gas-liquid separation film is so set to at least 5 nm that the chemical solution can be inhibited from permeating the first gas-liquid separation film, whereby the first insulating film can be prevented from penetration of the chemical solution. The thickness of the first gas-liquid separation film is so set to not more than 15 nm that a gas can easily permeate the first gas-liquid separation film thereby easily recovering the first insulating film from deterioration.

In the aforementioned semiconductor device according to the first aspect, the first insulating film preferably includes a porous insulating film. According to this structure, the first gas-liquid separation film can easily inhibit the liquid from penetrating into the first insulating film when the first insulating film is prepared from a porous material easily penetrable by a liquid such as a chemical solution.

A method of fabricating a semiconductor device according to a second aspect of the present invention comprises steps of forming a first insulating film on a substrate, forming a first gas-liquid separation film composed of a material hardly permeable by a liquid and easily permeable by a gas at least on a part of the surface of the first insulating film, forming a wiring layer on at least the part of the surface of the first insulating film by plating and recovering the first insulating film from deterioration by annealing the same in a prescribed gas atmosphere.

In the method of fabricating a semiconductor device according to the second aspect, as hereinabove described, the first gas-liquid separation film of the material hardly permeable by a liquid and easily permeable by a gas is so formed on at least a part of the surface of the first insulating film that the same can inhibit a liquid from penetrating into the first insulating film and can be inhibited from blocking penetration of a gas into the first insulating film. Thus, the first gas-liquid separation film can inhibit a liquid such as a plating solution (chemical solution) from penetrating into the first insulating film when the wiring layer is formed at least on the part of the surface of the first insulating film by plating. Consequently, the first insulating film can be prevented from deterioration resulting from the liquid such as a plating solution (chemical solution) penetrating into the first insulating film. Further, a prescribed gas can be introduced into the first insulating film through the first gas-liquid separation film when the first insulating film is recovered from deterioration by annealing the same in the prescribed gas atmosphere. Consequently, the first insulating film can be recovered from deterioration with the prescribed gas.

The aforementioned method of fabricating a semiconductor device according to the second aspect preferably further comprises a step of forming a first opening for communicating with a part of the surface of the substrate in the first insulating film in advance of the step of forming the first gas-liquid separation film, the step of forming the first gas-liquid separation film preferably includes a step of forming the first gas-liquid separation film at least either on the inner surface of the first opening of the first insulating film or on the upper surface of the first insulating film opposite to the substrate, and the step of forming the wiring layer by plating preferably includes a step of forming the wiring layer inside the first opening of the first insulating film. According to this structure, the liquid such as a chemical solution can be inhibited from penetrating into the first insulating film at least either through the inner surface of the first opening of the first insulating film or through the upper surface of the first insulating film opposite to the substrate in the method of fabricating a semiconductor device having the step of forming the wiring layer inside the first opening of the first insulating film. Further, a prescribed gas for recovering the first insulating film from deterioration can be introduced into the first insulating film at least either through the inner surface of the first opening of the first insulating film or through the upper surface of the first insulating film opposite to the substrate. Thus, the first insulating film can be easily prevented from deterioration resulting from the liquid such as a chemical solution penetrating into the same and easily recovered from deterioration with the prescribed gas in the method of fabricating a semiconductor device having the step of forming the wiring layer inside the first opening of the first insulating film.

In this case, the step of forming the first gas-liquid separation film preferably includes a step of forming the first gas-liquid separation film on both of the inner surface of the first opening of the first insulating film and the upper surface of the first insulating film opposite to the substrate. According to this structure, the liquid such as a chemical solution can be inhibited from penetrating into the first insulating film through both of the inner surface of the first opening of the first insulating film and the upper surface of the first insulating film opposite to the substrate. Thus, the first insulating film can be further prevented from deterioration resulting from the liquid such as a chemical solution penetrating into the same. Further, the first gas-liquid separation film is so formed on both of the inner surface of the first opening of the first insulating film and the upper surface of the first insulating film opposite to the substrate that the prescribed gas for recovering the first insulating film from deterioration can be introduced into the first insulating film through both of the inner surface of the first opening of the first insulating film and the upper surface of the first insulating film opposite to the substrate. Thus, the quantity of the prescribed gas penetrating into the first insulating film can be so increased that the first insulating film can be recovered from deterioration in a short time and the rate of recovering the first insulating film from deterioration can be improved.

The aforementioned method of fabricating a semiconductor device comprising the step of forming the first opening in the first insulating film preferably further comprises a step of forming a barrier metal layer inside the first opening of the first insulating film in advance of the step of forming the wiring layer, while the step of forming the wiring layer preferably includes a step of forming the wiring layer on the substrate through the barrier metal layer formed inside the first opening of the first insulating film. According to this structure, the barrier metal layer can inhibit the wiring layer from diffusing into the substrate.

The aforementioned method of fabricating a semiconductor device comprising the step of forming the first opening in the first insulating film preferably further comprises steps of forming a second insulating film on the first insulating film, forming a second opening connected to the first opening of the first insulating film in the second insulating film and forming a second gas-liquid separation film composed of a material hardly permeable by a liquid and easily permeable by a gas at least either on the inner surface of the second opening of the second insulating film or on the upper surface of the second insulating film opposite to the substrate in advance of the step of forming the wiring layer by plating, while the step of forming the wiring layer preferably includes a step of forming the wiring layer inside the first and second openings. According to this structure, a semiconductor device of a two-layer structure capable of inhibiting interlayer dielectric films from deterioration and recovering the, same from deterioration can be obtained.

In the aforementioned method of fabricating a semiconductor device according to the second aspect, the first gas-liquid separation film preferably includes a gas-liquid separation film composed of SiOC. According to this structure, the first gas-liquid separation film composed of SiOC hardly permeable by a liquid and easily permeable by a gas can easily inhibit a liquid from penetrating into the first insulating film and can be easily inhibited from blocking penetration of a gas into the first insulating film.

In this case, the first gas-liquid separation film preferably has a thickness of at least 5 nm and not more than 15 nm. The thickness of the first gas-liquid separation film is so set to at least 5 nm that the chemical solution can be inhibited from permeating the first gas-liquid separation film, whereby the first insulating film can be prevented from penetration of the chemical solution. The thickness of the first gas-liquid separation film is so set to not more than 15 nm that a gas can easily permeate the first gas-liquid separation film thereby easily recovering the first insulating film from deterioration.

In the aforementioned method of fabricating a semiconductor device according to the second aspect, the first insulating film preferably includes a porous insulating film. According to this structure, the first gas-liquid separation film can easily inhibit the liquid from penetrating into the first insulating film when the first insulating film is prepared from a porous material easily penetrable by a liquid such as a chemical solution.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
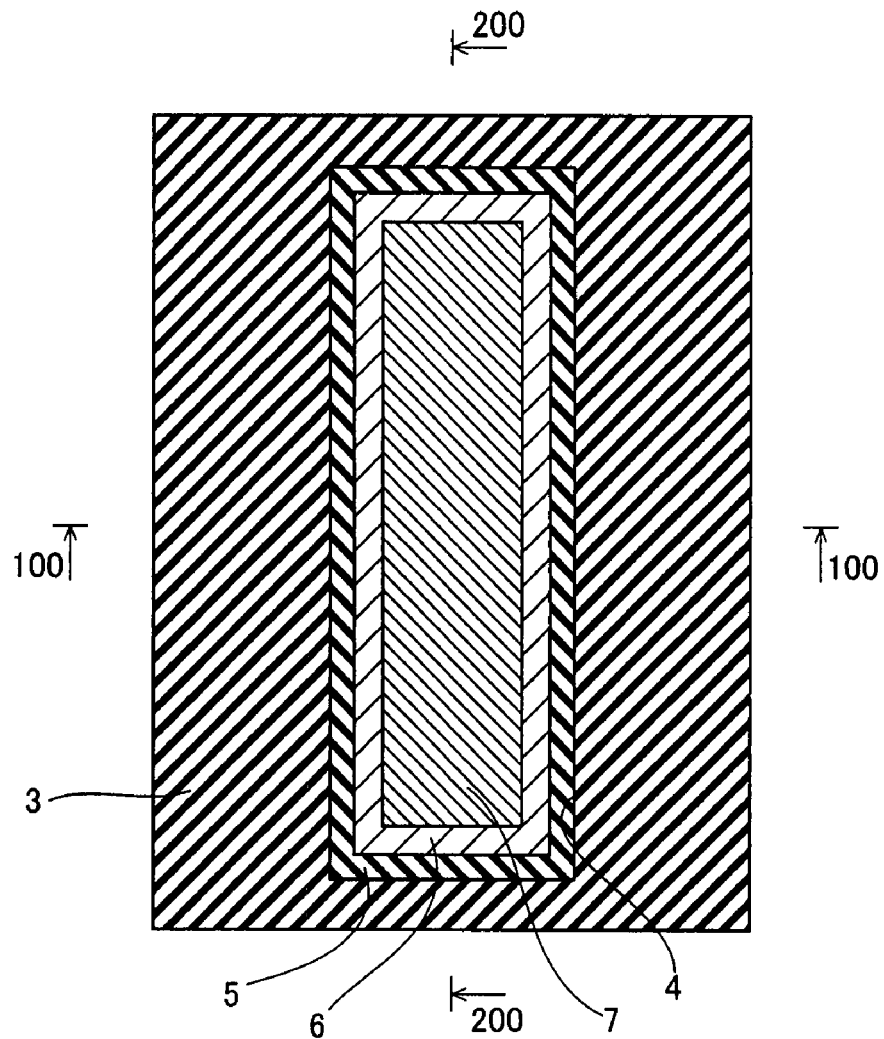
FIG. 1 is a plan view showing the structure of a semiconductor device according to a first embodiment of the present invention.

The structure of a semiconductor device according to a first embodiment of the present invention is described with reference to FIGS. 1 to 3.

Figure 2:
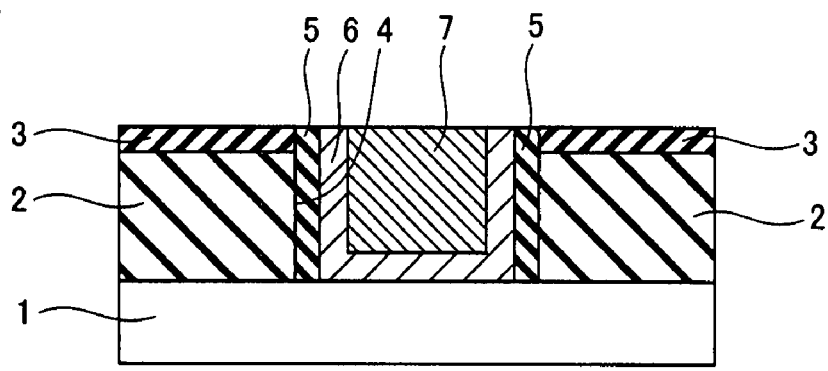
FIG. 2 is a sectional view taken along the line 100-100 in FIG. 1.
Figure 3:
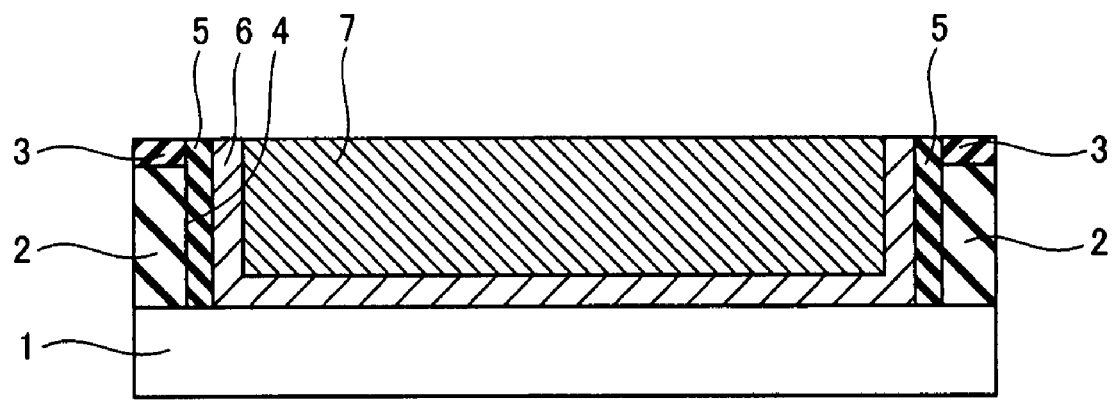
FIG. 3 is a sectional view taken along the line 200-200 in FIG. 1.

As shown in FIGS. 2 and 3, the semiconductor device according to the first embodiment has a single damascene wiring structure. More specifically, an interlayer dielectric film 2 consisting of a porous $SiO_2$ film having a thickness of about 130 nm is formed on a silicon substrate 1 having a transistor (not shown) in the semiconductor device according to the first embodiment. The silicon substrate 1 is an example of the "substrate" in the present invention, and the interlayer dielectric film 2 is an example of the "first insulating film" in the present invention.

According to the first embodiment, a gas-liquid separation film 3 consisting of an SiOC film having a thickness of about 15 nm is formed on the upper surface of the interlayer dielectric film 2. The gas-liquid separation film 3 is an example of the "first gas-liquid separation film" in the present invention. This gas-liquid separation film 3 of SiOC is hardly permeable by a liquid and easily permeable by a gas. A trench 4 bottomed by the upper surface of the silicon substrate 1 is formed through the interlayer dielectric film 2 and the gas-liquid separation film 3. As shown in FIG. 1, the trench 4 slenderly extends in the longitudinal direction of the semiconductor device in plan view. This trench 4 partially exposes the upper surface of the silicon substrate 2 from the interlayer dielectric film 2 and the gas-liquid separation film 3. The trench 4 is an example of the "first opening" in the present invention.

According to the first embodiment, another gas-liquid separation film 5 consisting of an SiOC film having a thickness of about 15 nm is formed on the inner side surfaces of the trench 4. The gas-liquid separation film 5 is an example of the "first gas-liquid separation film" in the present invention. This gas-liquid separation film 5 of SiOC is hardly permeable by a liquid and easily permeable by a gas, similarly to the aforementioned gas-liquid separation film 3.

On a region located inside the trench 4, a barrier metal layer 6 having a shape reflecting that of the trench 4 is formed on the upper surface of the portion of the silicon substrate 1 corresponding to the trench 4 and the side surfaces of the gas-liquid separation film 5. This barrier metal layer 6 is in a multilayer structure of a lower TaN layer having a thickness of about 15 nm and an upper Ta layer also having a thickness of about 15 nm. On the region located inside the trench 4, further, a wiring layer 7 of Cu is formed on the barrier metal layer 6, to fill up the trench 4.

According to the first embodiment, the gas-liquid separation films 3 and 5, formed on the upper surface of the porous interlayer dielectric film 2 and on the inner side surfaces of the trench 4 respectively as hereinabove described, can inhibit liquids from penetrating into the porous interlayer dielectric film 2 easily penetrable by liquids and can be inhibited from blocking penetration of a gas into the interlayer dielectric film 2. When a wet process using liquids such as chemical solutions is employed in any step of preparing the semiconductor device, therefore, the gas-liquid separation films 3 and 5 can inhibit the liquids such as chemical solutions from penetrating into the porous interlayer dielectric film 2 having high hygroscopicity. Consequently, the porous interlayer dielectric film 2 can be prevented from deterioration resulting from the liquids such as chemical solutions penetrating into the same. When a plasma process is employed in another step of preparing the semiconductor device and the interlayer dielectric film 2 is damaged by high-energy radical contained in plasma, on the other hand, a prescribed gas for recovering the interlayer dielectric film 2 from deterioration can be introduced into the interlayer dielectric film 2 through the gas-liquid separation films 3 and 5. Consequently, the: interlayer dielectric film 2 can be recovered from deterioration with the prescribed gas.

According to the first embodiment, as hereinabove described, the gas-liquid separation films 3 and 5 are formed on the upper surface of the interlayer dielectric film 2 and on the inner side surfaces of the trench 4 respectively, whereby liquids such as chemical solutions can be inhibited from penetrating into the interlayer dielectric film 2 through both of the upper surface of the interlayer dielectric film 2 and the inner side surfaces of the trench 4. Thus, the interlayer dielectric film 2 can be further prevented from deterioration resulting from the liquids such as chemical solutions penetrating into the same. Further, the gas-liquid separation films 3 and 5 are so formed on the upper surface of the interlayer dielectric film 2 and on the inner side surfaces of the trench 4 respectively that the prescribed gas for recovering the interlayer dielectric film 2 from deterioration can be introduced into the interlayer dielectric film 2 through both of the upper surface of the interlayer dielectric film 2 and the inner side surfaces of the trench 4. Thus, the quantity of the prescribed gas penetrating into the interlayer dielectric film 2 can be so increased that the interlayer dielectric film 2 can be recovered from deterioration in a short time and the rate of recovering the interlayer dielectric film 2 from deterioration can be improved.

According to the first embodiment, as hereinabove described, the gas-liquid separation films 3 and 5 composed of SiOC hardly permeable by a liquid and easily permeable by a gas can easily inhibit liquids from penetrating into the interlayer dielectric film 2 and can be inhibited from blocking penetration of a gas into the interlayer dielectric film 2.

A process of fabricating the semiconductor device according to the first embodiment is now described with reference to FIGS. 1 to 10.

Figure 4:
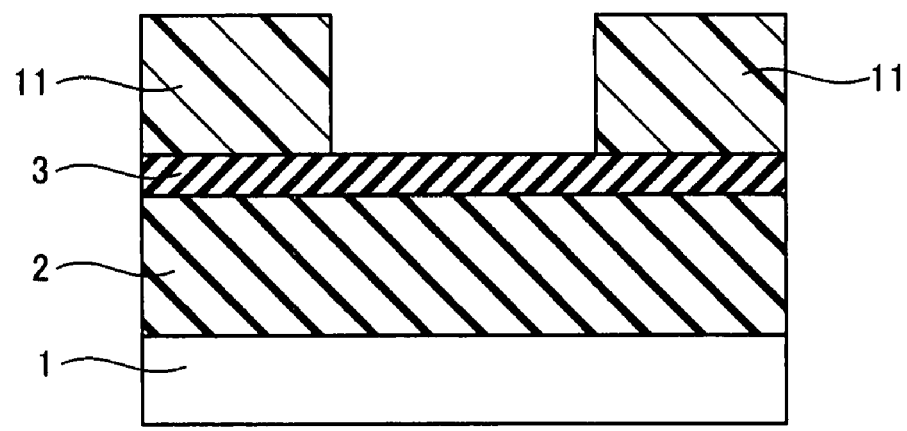
FIGS. 4 to 6 are sectional views for illustrating a process of fabricating the semiconductor device according to the first embodiment of the present invention.

As shown in FIG. 4, a precursor solution for the porous $SiO_2$ film is applied onto the silicon substrate 1 having the transistor (not shown) by spin coating. This precursor solution consists of a surfactant, TEOS (tetraethoxysilane), water, acid and alcohol. Thereafter the precursor solution applied onto the silicon substrate 1 is annealed with a hot plate and thereafter calcined in a gas atmosphere containing nitrogen and TMCTS (tetramethylcyclotetrasiloxane) under a temperature condition of about 400° C. Thus, the interlayer dielectric film 2 of the porous $SiO_2$ film having the thickness of about 130 nm is formed on the silicon substrate 1.

According to the first embodiment, the gas-liquid separation film 3 of SiOC having the thickness of about 30 nm is thereafter formed on the interlayer dielectric film 2 by plasma CVD (chemical vapor deposition) through a capacitivity coupled plasma CVD apparatus (Dragon 2300 by ASM). At this time, DMDMOS (dimethyldimethoxysilane) gas and He gas are employed as reaction gases with flow rates set to about 80 sccm and about 80 sccm respectively. Further, a chamber pressure, the substrate temperature, power applied to electrodes on which no substrate is set, a power frequency and an interelectrode distance are set to about 1160 Pa, about 350° C., about 1000 W, about 27.12 MHz and about 20 mm respectively. Thereafter a resist film 11 is formed on a region of the gas-liquid separation film 3 other than that corresponding to the trench 4 (see FIG. 2).

Figure 5:
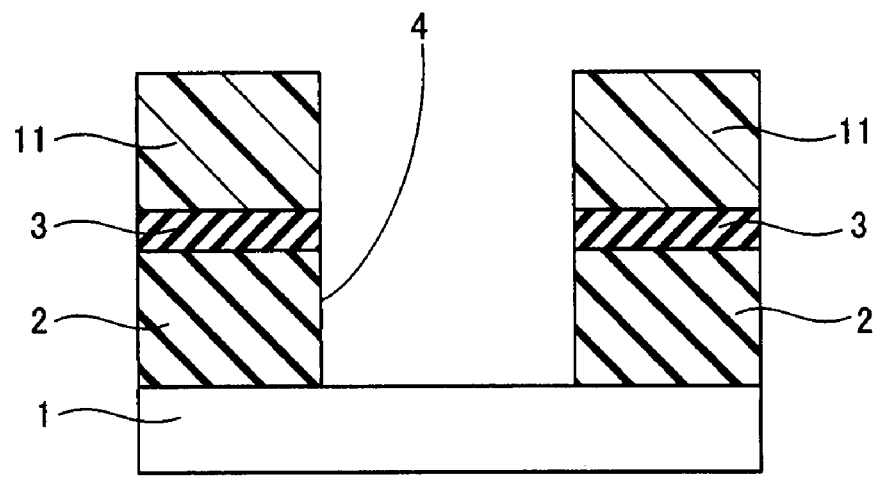

As shown in FIG. 5, the gas-liquid separation film 3 and the interlayer dielectric film 2 are etched by RIE (reactive ion etching) through the resist film 11 serving as a mask, to partially expose the upper surface of the silicon substrate 1. At this time, $CF_4$ gas is employed as a reaction gas with a flow rate and a pressure set to about 200 sccm and about 1 Pa respectively. Further, plasma power is set to about 800 W under a frequency of about 450 MHz, a wafer bias (bias power for the silicon substrate 1) is set to about 200 W under a frequency of about 800 KHz, and the substrate temperature is set to about 50° C. Thus, the trench 4 bottomed by the upper surface of the silicon substrate 1 is formed.

Then, the resist film 11 is removed by RIE. At this time, $NH_3$ gas is employed as a reaction gas with a flow rate and a pressure set to about 200 sccm and about 2 Pa respectively. Further, plasma power is set to about 1400 W under a frequency of about 450 MHz, the wafer bias (bias power for the silicon substrate 1) is set to about 200 W under a frequency of about 800 KHz, and the substrate temperature is set to about 50° C. Thereafter the silicon substrate 1, the interlayer dielectric film 2 and the gas-liquid separation film 3 are washed.

Figure 6:
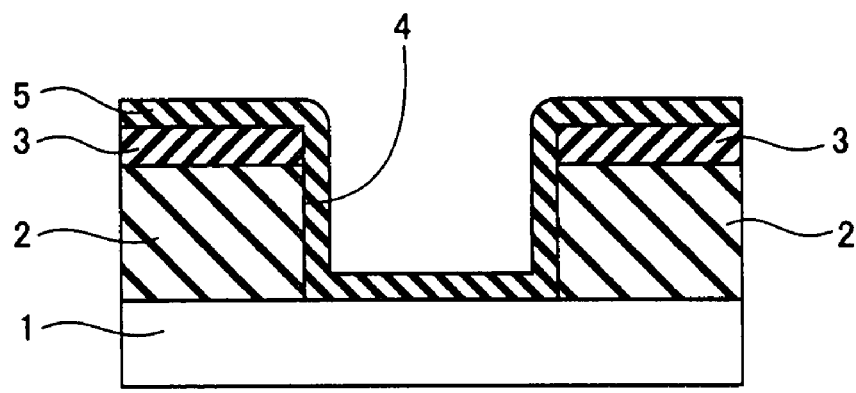

According to the first embodiment, the gas-liquid separation film 5 of SiOC having the thickness of about 15 nm is formed on the overall surface by plasma CVD, as shown in FIG. 6. This gas-liquid separation film 5 is formed under conditions similar to those for the aforementioned gas-liquid separation film 3.

Figure 7:
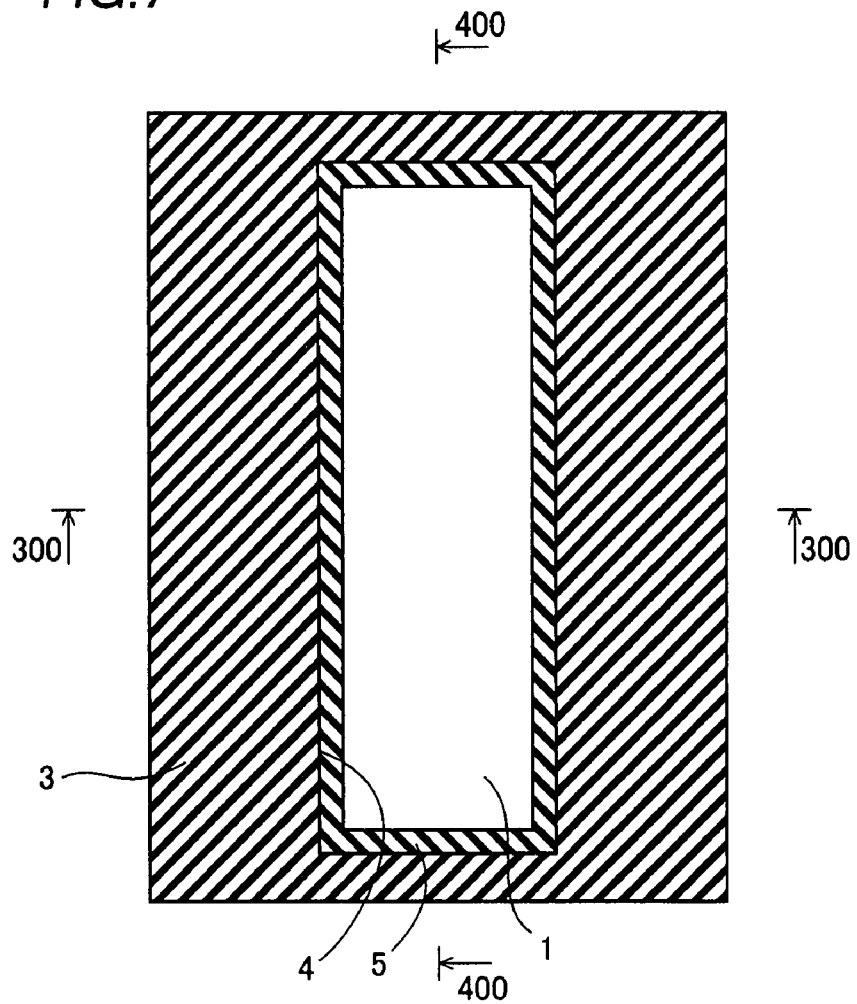
FIG. 7 is a plan view for illustrating the process of fabricating the semiconductor device according to the first embodiment of the present invention.
Figure 8:
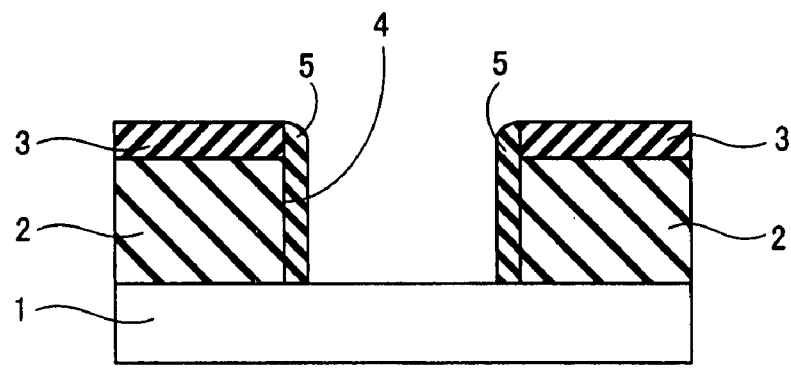
FIG. 8 is a sectional view taken along the line 300-300 in FIG. 7.
Figure 9:
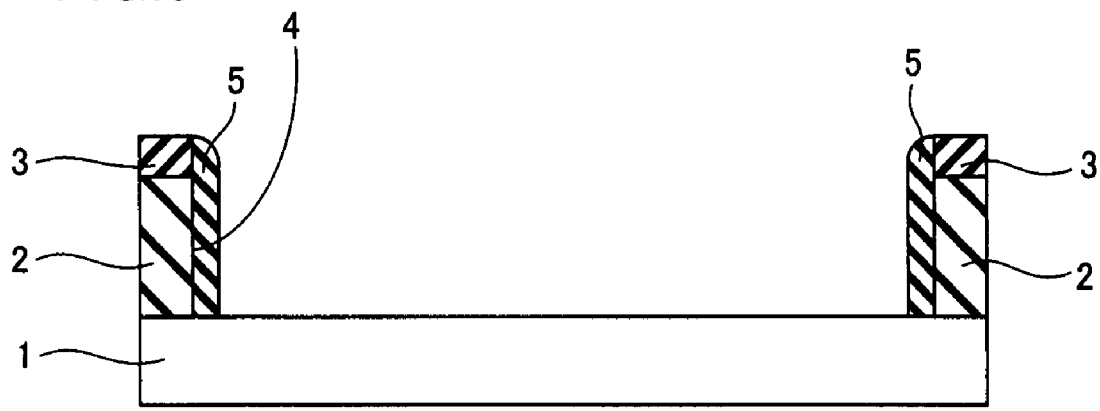
FIG. 9 is a sectional view taken along the line 400-400 in FIG. 7.

As shown in FIGS. 7 to 9, the gas-liquid separation film 5 is anisotropically etched to expose the upper surfaces of the gas-liquid separation film 3 and the silicon substrate 1. At this time, a portion, located on the inner side surfaces of the trench 4, of the gas-liquid separation film 5 having a large vertical thickness with respect to the upper surface of the silicon substrate 1 remains unetched. Thus, the gas-liquid separation film 5 is brought into the form of a side wall arranged only on the inner side surfaces of the trench 4.

Figure 10:
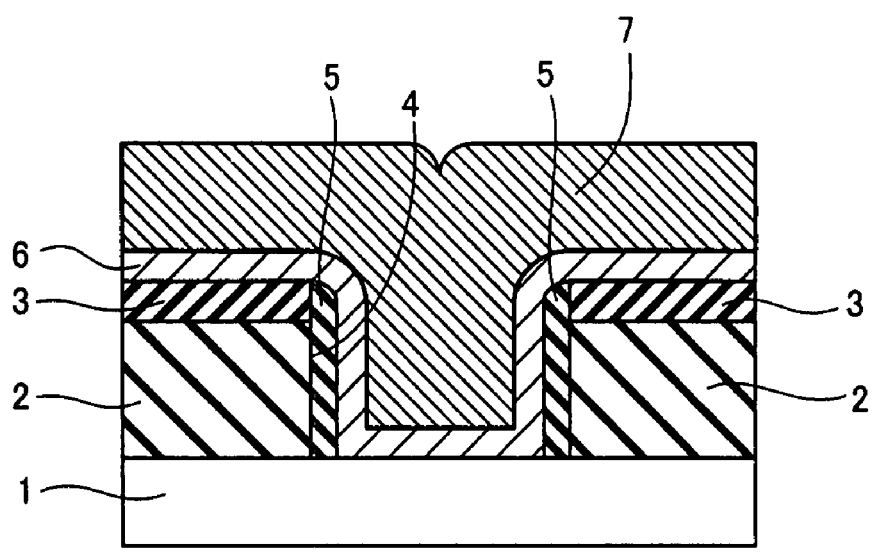
FIG. 10 is a sectional view for illustrating the process of fabricating the semiconductor device according to the first embodiment of the present invention.

As shown in FIG. 10, the barrier metal layer 6 having the shape reflecting that of the trench 4 is formed on the overall surface by sputtering. This barrier metal layer 6 is prepared by successively forming the TaN layer having the thickness of about 15 nm and the Ta layer having the thickness of about 15 nm. Thereafter a seed layer (not shown) of Cu for plating is formed on the barrier metal layer 6 by sputtering.

Then, Cu is deposited on the seed layer (not shown) by electroplating. A plating solution (Ebatronfill2 by Ebara-Eudylite Co., Ltd.) containing copper sulfide, a surfactant and polyethylene glycol is employed for this plating step (wet process). Thus, the wiring layer 7 of Cu is formed on the seed layer to fill up the trench 4.

According to the first embodiment, the barrier metal layer 6 and the gas-liquid separation films 3 and 5 can inhibit the plating solution from penetrating into the interlayer dielectric film 2 in the aforementioned plating step (wet process). Consequently, the interlayer dielectric film 2 can be prevented from deterioration resulting from the plating solution penetrating into the same.

The wiring layer 7 and the barrier metal layer 6 are thereafter polished by CMP (chemical mechanical polishing) from above the upper surface of the wiring layer 7, and the gas-liquid separation film 3 is thereafter polished until the thickness thereof reaches about 15 nm. In this CMP step (wet process), two types of Cu slurries (CMS7303 and CMS7304 by JSR Corporation) mixed with ammonium peroxodisulfide, an $H_2O_2$-added Ta slurry (HS-T605 by Hitachi Chemical Co., Ltd.), a washing solution (MCX-D250 by Mitsubishi Chemical Industries, Ltd.) for removing particles and another washing solution (MCX-SD1500 by Mitsubishi Chemical Industries, Ltd.) for metal decontamination are employed as chemical solutions. One of the Cu slurries contains a surfactant, potassium hydroxide and water, and the other Cu slurry contains $SiO_2$ and water. The Ta slurry contains $SiO_2$, an organic heterocyclic compound, organic acid, an alcohol compound and water. The washing solution for removing particles contains organic alkali, organic carboxylic acid, a surfactant and water. The washing solution for metal decontamination contains acetic acid, a surfactant and water. Thus, the semiconductor device is implemented in the structure having the wiring layer 7 formed only on the region located inside the trench 4 as shown in FIGS. 1 to 3.

According to the first embodiment, the gas-liquid separation films 3 and 5 can inhibit the chemical solutions for CMP from penetrating into the interlayer dielectric film 2 in the wet process of the aforementioned CMP step. Consequently, the interlayer dielectric film 2 can be prevented from deterioration resulting from the chemical solutions for CMP penetrating into the same.

Then, the interlayer dielectric film 2 is recovered from damage caused by the plasma in formation of the gas-liquid separation film 5 through the aforementioned plasma process. More specifically, the interlayer dielectric film 2 is annealed in a TMCTS gas atmosphere for recovering the same from deterioration under a temperature condition of about 400° C. According to the first embodiment, TMCTS gas can be introduced into the interlayer dielectric film 2 through the gas-liquid separation films 3 and 5 at this time. Consequently, the interlayer dielectric film 2 can be recovered from deterioration with the TMCTS gas.

Second Embodiment

Figure 11:
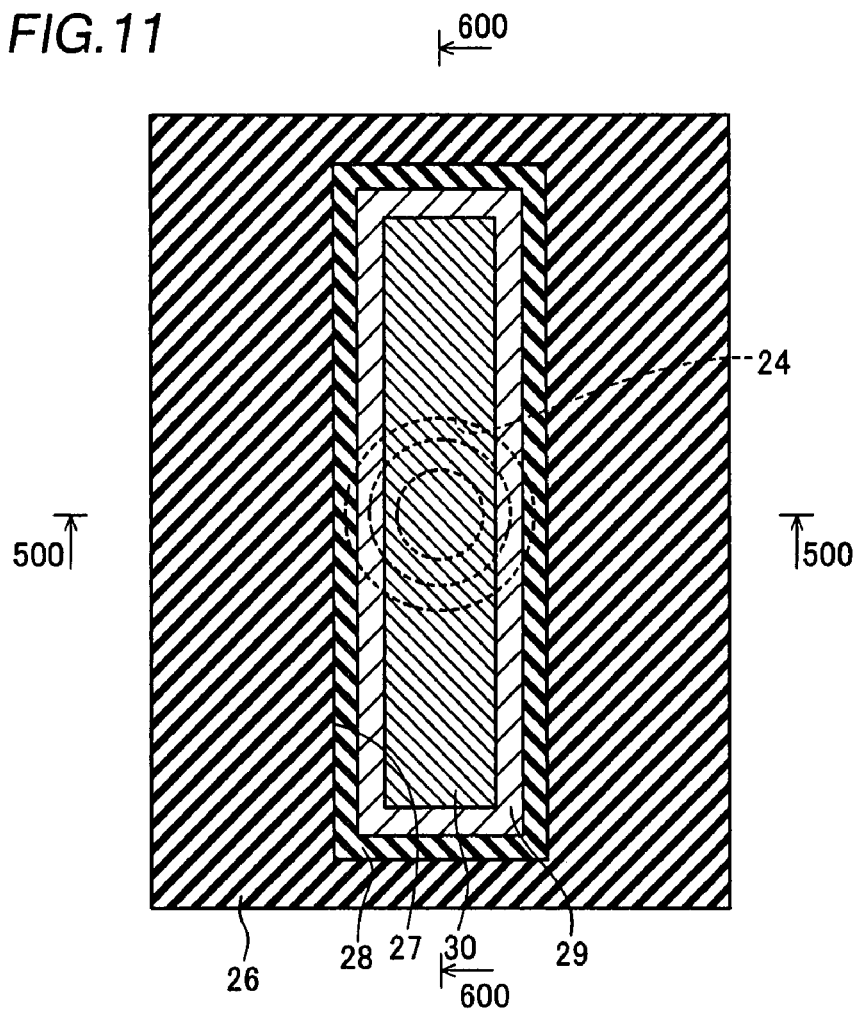
FIG. 11 is a plan view showing the structure of a semiconductor device according to a second embodiment of the present invention.
Figure 12:
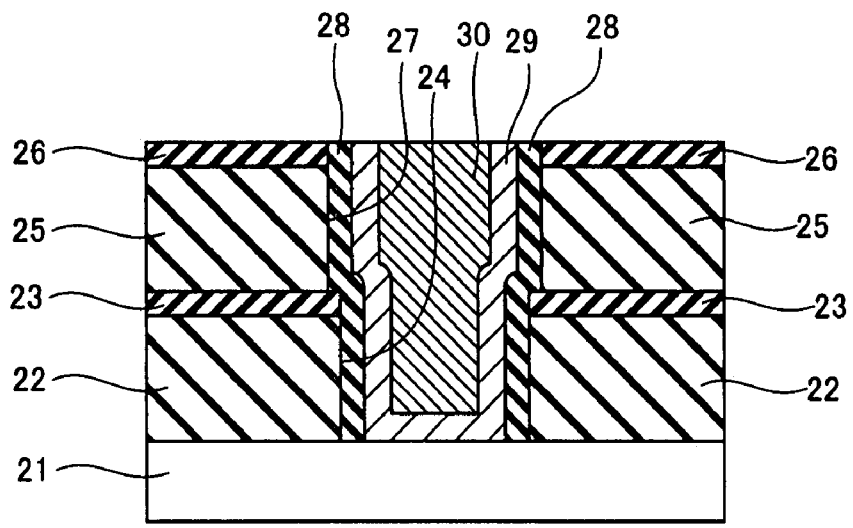
FIG. 12 is a sectional view taken along the line 500-500 in FIG. 11.
Figure 13:
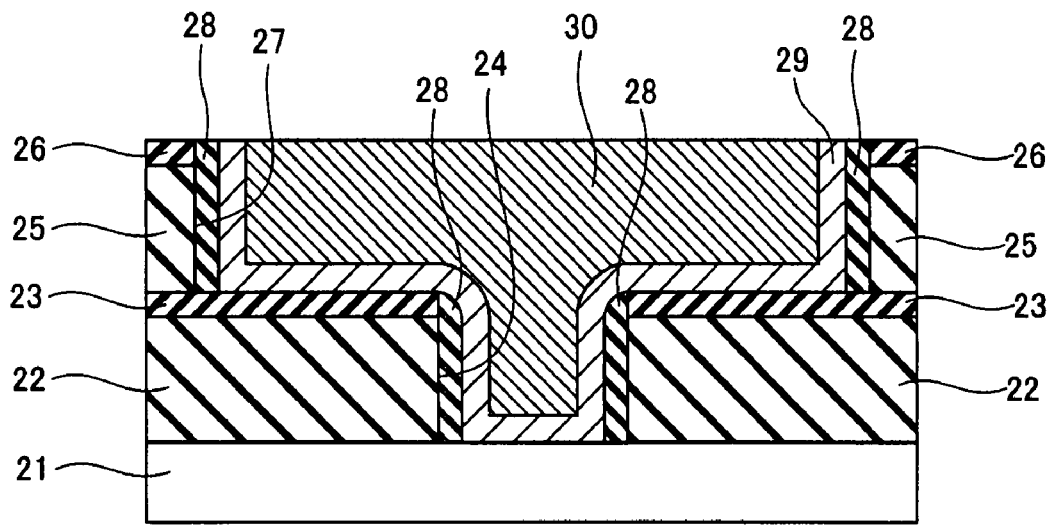
FIG. 13 is a sectional view taken along the line 600-600 in FIG. 11.

Referring to FIGS. 11 to 13, a semiconductor device according to a second embodiment of the present invention has a dual damascene wiring structure, dissimilarly to the aforementioned first embodiment.

In the semiconductor device according to the second embodiment, an interlayer dielectric film 22 consisting of a porous $SiO_2$ film having a thickness of about 130 nm is formed on a silicon substrate 21 having a transistor (not shown), as shown in FIGS. 12 and 13. The silicon substrate 21 is an example of the "substrate" in the present invention, and the interlayer dielectric film 22 is an example of the "first insulating film" in the present invention.

According to the second embodiment, a gas-liquid separation film 23 consisting of an SiOC film having a thickness of about 15 nm is formed on the interlayer dielectric film 22. The gas-liquid separation film 23 is an example of the "first gas-liquid separation film" in the present invention. This gas-liquid separation film 23 of SiOC is hardly permeable by a liquid and easily permeable by a gas. A via hole 24, circular in plan view, having a depth reaching the upper surface of the silicon substrate 21 is formed through the interlayer dielectric film 22 and the gas-liquid separation film 23, as shown in FIGS. 11 and 13. This via hole 24 partially exposes the surface of the silicon substrate 21 from the interlayer dielectric film 22 and the gas-liquid separation film 23. The via hole 24 is an example of the "first opening" in the present invention.

According to the second embodiment, another interlayer dielectric film 25 and another gas-liquid separation film 26 are successively formed on the gas-liquid separation film 23, as shown in FIGS. 12 and 13. The interlayer dielectric film 25 is an example of the "second insulating film" in the present invention, and the gas-liquid separation film 26 is an example of the "second gas-liquid separation film" in the present invention. The interlayer dielectric film 25 consists of a porous $SiO_2$ film having a thickness of about 130 nm, similarly to the aforementioned interlayer dielectric film 22. The gas-liquid separation film 26 consists of an SiOC film having a thickness of about 15 nm and is hardly permeable by a liquid and easily permeable by a gas, similarly to the aforementioned gas-liquid separation film 23. A trench 27, bottomed by the upper surface of the gas-liquid separation film 23, connected to the via hole 24 is formed through the interlayer dielectric film 25 and the gas-liquid separation film 26. The trench 27 slenderly extends in the longitudinal direction of the semiconductor device across the via hole 24 in plan view, as shown in FIG. 11. The trench 27 has a short-directional width larger than the diameter of the via hole 24 in plan view. This trench 27 partially exposes the surface of the silicon substrate 21 from the interlayer dielectric film 25 and the gas-liquid separation film 26 through the via hole 24. The trench 27 further partially exposes the upper surface of the gas-liquid separation film 23 from the interlayer dielectric film 25 and the gas-liquid separation film 26. The trench 27 is an example of the "second opening" in the present invention.

According to the second embodiment, still another gas-liquid separation film 28 consisting of an SiOC film having a thickness of about 15 nm is formed on the inner side surfaces of the via hole 24 and the trench 27, as shown in FIGS. 12 and 13. The gas-liquid separation film 28 is an example of the "first gas-liquid separation film" or the "second gas-liquid separation film" in the present invention. This gas-liquid separation film 28 of SiOC is hardly permeable by a liquid and easily permeable by a gas, similarly to the aforementioned gas-liquid separation films 23 and 27.

On a region located inside the via hole 24 and the trench 27, a barrier metal layer 29 having a shape reflecting those of the via hole 24 and the trench 27 is formed on the upper surface of the portion of the silicon substrate 21 corresponding to the via hole 24 and the side surfaces of the gas-liquid separation film 28, to be connected to the transistor (not shown). This barrier metal layer 29 is in a multilayer structure of a lower TaN layer having a thickness of about 15 nm and an upper Ta layer also having a thickness of about 15 nm. On the region located inside the via hole 24 and the trench 27, further, a wiring layer 30 of Cu is formed on the barrier metal layer 29, to fill up the via hole 24 and the trench 27.

According to the second embodiment, as hereinabove described, the gas-liquid separation films 23 and 26 formed on the upper surfaces of the interlayer dielectric films 22 and 25 respectively and the gas-liquid separation film 28 formed on the inner side surfaces of the via hole 24 and the trench 27 can inhibit liquids from penetrating into the interlayer dielectric films 22 and 25 and can be inhibited from blocking penetration of a gas into the interlayer dielectric films 22 and 25. When a wet process using liquids such as chemical solutions is employed in any step of preparing the semiconductor device, therefore, the gas-liquid separation films 23, 26 and 28 can inhibit the liquids such as chemical solutions from penetrating into the interlayer dielectric films 22 and 25. Consequently, the interlayer dielectric films 22 and 25 can be prevented from deterioration resulting from the liquids such as chemical solutions penetrating into the same. When a plasma process is employed in another step of preparing the semiconductor device and the interlayer dielectric films 22 and 25 are damaged by high-energy radical contained in plasma, on the other hand, a prescribed gas for recovering the interlayer dielectric films 22 and 25 from deterioration can be introduced into the interlayer dielectric films 22 and 25 through the gas-liquid separation films 23, 26 and 28. Consequently, the interlayer dielectric films 22 and 25 can be recovered from deterioration with the prescribed gas.

According to the second embodiment, as hereinabove described, the gas-liquid separation films 23 and 26 are formed on the upper surfaces of the interlayer dielectric films 22 and 25 respectively and the gas-liquid separation film 28 is formed on the inner side surfaces of the via hole 24 and the trench 27, whereby liquids such as chemical solutions can be inhibited from penetrating into the interlayer dielectric films 22 and 25 through both of the upper surfaces of the interlayer dielectric films 22 and 25 and the inner side surfaces of the via hole 24 and the trench 27. Thus, the interlayer dielectric films 22 and 25 can be further prevented from deterioration resulting from the liquids such as chemical solutions penetrating into the same. Further, the gas-liquid separation films 23 and 26 are so formed on the upper surfaces of the interlayer dielectric films 22 and 25 respectively and the gas-liquid separation film 28 is so formed on the inner side surfaces of the via hole 24 and the trench 27 that the prescribed gas for recovering the interlayer dielectric films 22 and 25 from deterioration can be introduced into the interlayer dielectric films 22 and 25 through the upper surfaces of the interlayer dielectric films 22 and 25 as well as the inner side surfaces of the via hole 24 and the trench 27. Thus, the quantity of the prescribed gas penetrating into the interlayer dielectric films 22 and 25 can be so increased that the interlayer dielectric films 22 and 25 can be recovered from deterioration in a short time and the rate of recovering the interlayer dielectric films 22 and 25 from deterioration can be improved.

The remaining effects of the second embodiment are similar to those of the aforementioned first embodiment.

A process of fabricating the semiconductor device according to the second embodiment is now described with reference to FIGS. 11 to 22.

Figure 14:
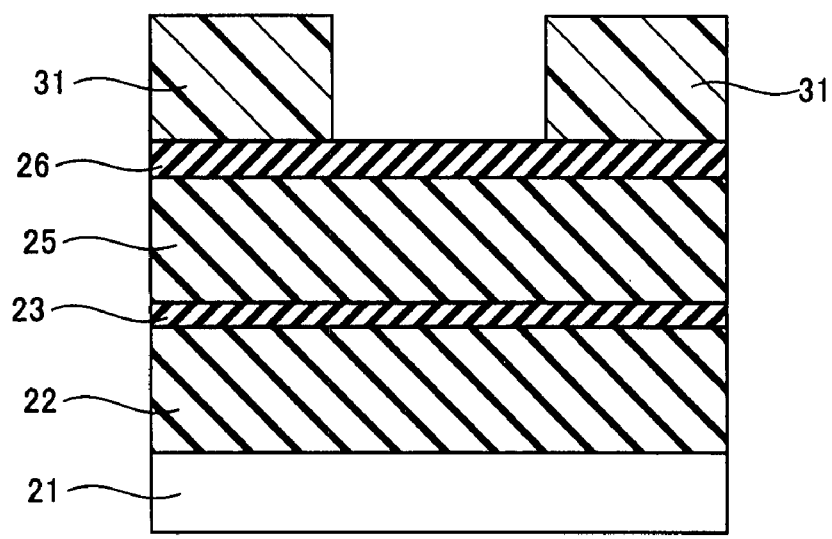
FIGS. 14 to 18 are sectional views for illustrating a process of fabricating the semiconductor device according to the second embodiment of the present invention.

As shown in FIG. 14, a precursor solution for the porous $SiO_2$ film is applied onto the silicon substrate 21 having the transistor (not shown) by spin coating. This precursor solution consists of a surfactant, TEOS, water, acid and alcohol. Thereafter the precursor solution applied onto the silicon substrate 21 is annealed with a hot plate and thereafter calcined in a gas atmosphere containing nitrogen and TMCTS under a temperature condition of about 400° C. Thus, the interlayer dielectric film 22 of the porous $SiO_2$ film having the thickness of about 130 nm is formed on the silicon substrate 21.

According to the second embodiment, the gas-liquid separation film 23 of SiOC having the thickness of about 30 nm is thereafter formed on the interlayer dielectric film 22 by plasma CVD through a capacitivity coupled plasma CVD apparatus. At this time, DMDMOS gas and He gas are employed as reaction gases with flow rates set to about 80 sccm and about 80 sccm respectively. Further, a chamber pressure, the substrate temperature, power applied to electrodes on which no substrate is set, a power frequency and an interelectrode distance are set to about 1160 Pa, about 350° C., about 1000 W, about 27.12 MHz and about 20 mm respectively.

Then, the interlayer dielectric film 25 consisting of the porous $SiO_2$ film having the thickness of about 130 nm and the gas-liquid separation film 26 consisting of the SiOC film having the thickness of about 30 nm are successively formed on the gas-liquid separation film 23. The interlayer dielectric film 25 and the gas-liquid separation film 26 are formed under conditions similar to those for the aforementioned interlayer dielectric film 22 and the aforementioned gas-liquid separation film 23 respectively. Thereafter a resist film 31 is formed on a region of the gas-liquid separation film 26 other than that corresponding to the via hole 24 (see FIG. 12).

Figure 15:
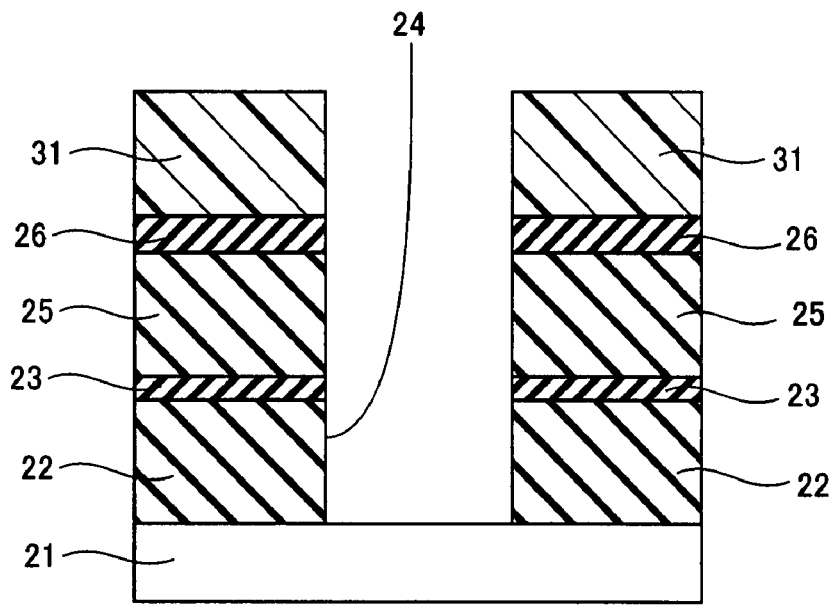
Figure 16:
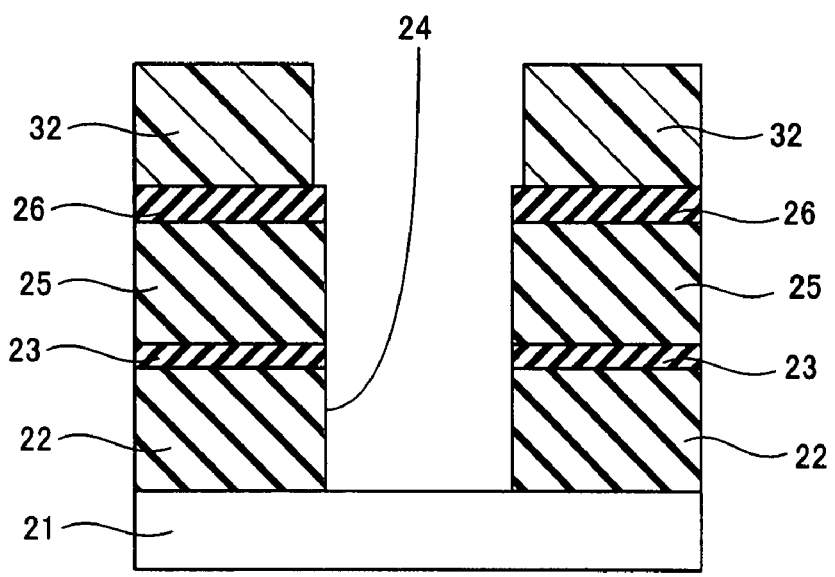

As shown in FIG. 15, the gas-liquid separation film 26, the interlayer dielectric film 25, the gas-liquid separation film 23 and the interlayer dielectric film 22 are etched by RIE through the resist film 31 serving as a mask, to partially expose the upper surface of the silicon substrate 21. At this time, Ar gas, $CHF_3$ gas and $N_2$ gas are employed as reaction gases with flow rates set to about 600 sccm, about 25 sccm and about 100 sccm respectively and pressures set to about 2 Pa. Further, plasma power is set to about 300 W under a frequency of about 450 MHz, a wafer bias (bias power for the silicon substrate 21) is set to about 600 W under a frequency of about 800 KHz, and the substrate temperature is set to about 50° C. Thus, the via hole 24 having the depth reaching the upper surface of the silicon substrate 21 is formed.

Then, the resist film 31 is removed by RIE. At this time, $NH_3$ gas is employed as a reaction gas with a flow rate and a pressure set to about 200 sccm and about 2 Pa respectively. Further, plasma power is set to about 1400 W under a frequency of about 450 MHz, the wafer bias (bias power for the silicon substrate 21) is set to about 200 W under a frequency of about 800 KHz, and the substrate temperature is set to about 50° C.

Then, another resist film 32 is formed on another region of the gas-liquid separation film 26 other than that corresponding to the trench 27 (see FIG. 12).

Figure 17:
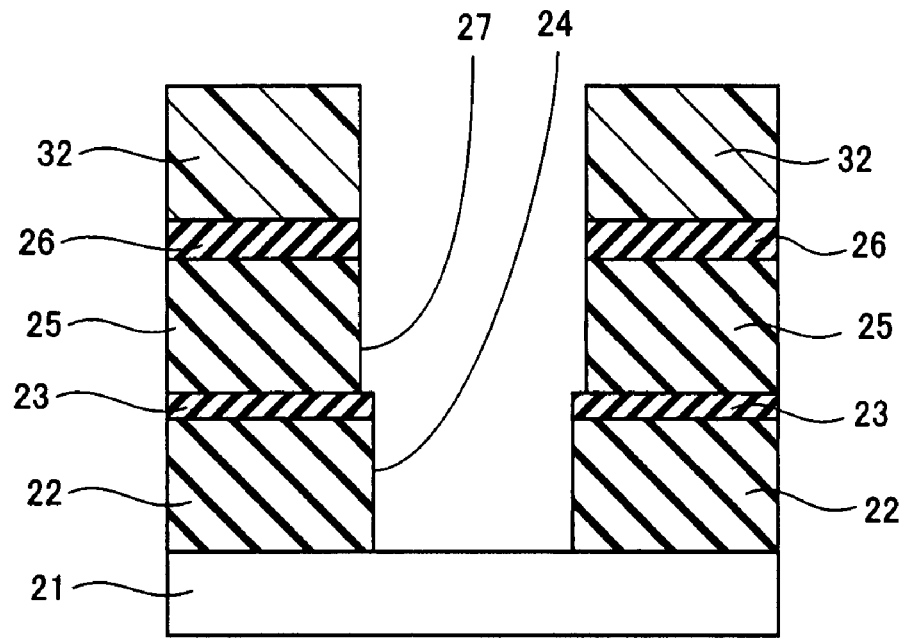

As shown in FIG. 17, the gas-liquid separation film 26 and the interlayer dielectric film 25 are etched by RIE through the resist film 32 serving as a mask, to partially expose the upper surface of the gas-liquid separation film 23. At this time, $CF_4$ gas is employed as a reaction gas with a flow rate and a pressure set to about 200 sccm and about 1 Pa respectively. Further, plasma power is set to about 800 W under a frequency of about 450 MHz, the wafer bias is set to about 200 W under a frequency of about 800 KHz, and the substrate temperature is set to about 50° C. Thus, the trench 27 bottomed by the upper surface of the gas-liquid separation film 23 is formed.

Then, the resist film 32 is removed by RIE. This resist film 32 is removed under conditions similar to those for removing the aforementioned resist film 31. Thereafter the silicon substrate 21, the interlayer dielectric film 22, the gas-liquid separation film 23, the interlayer dielectric film 25 and the gas-liquid separation film 26 are washed.

Figure 18:
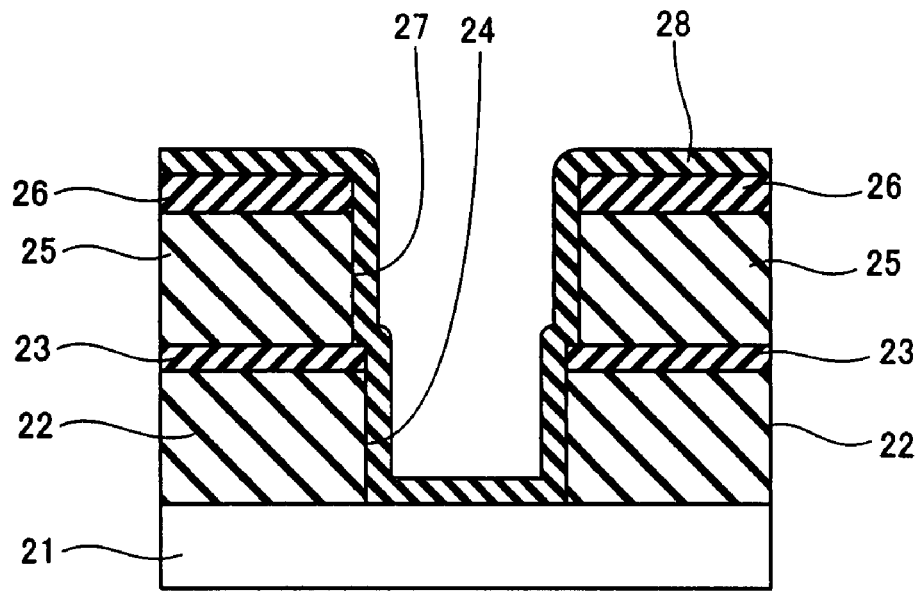

According to the second embodiment, the gas-liquid separation film 28 of SiOC having the thickness of about 15 nm is formed on the overall surface by plasma CVD, as shown in FIG. 18. This gas-liquid separation film 28 is formed under conditions similar to those for the aforementioned gas-liquid separation film 23.

Figure 19:
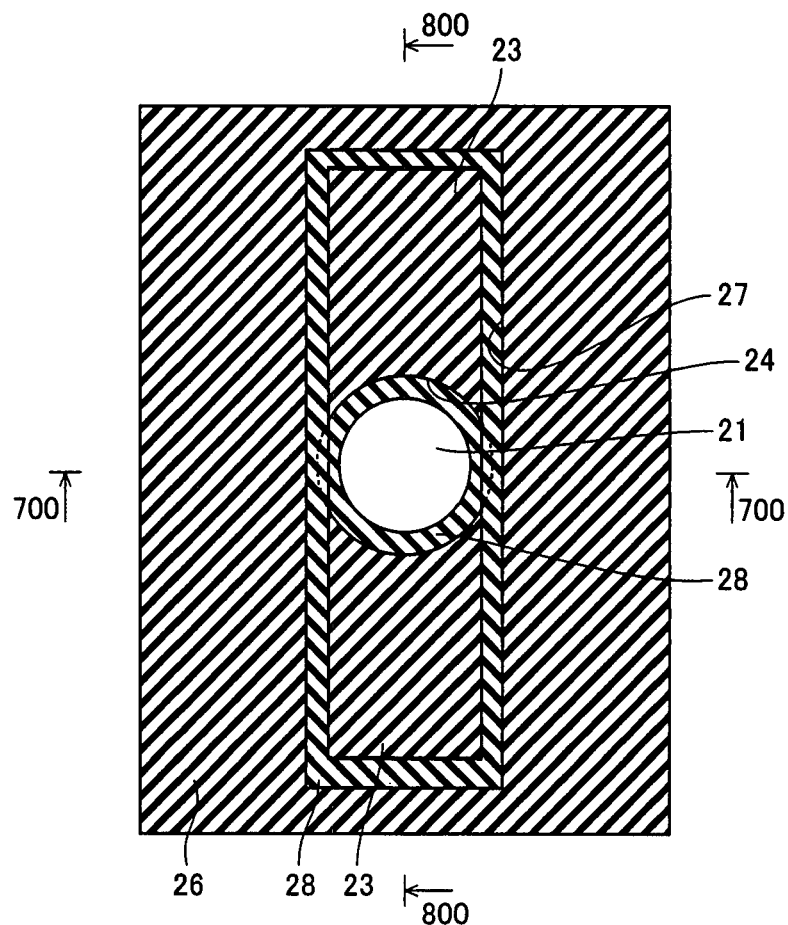
FIG. 19 is a plan view for illustrating the process of fabricating the semiconductor device according to the second embodiment of the present invention.
Figure 20:
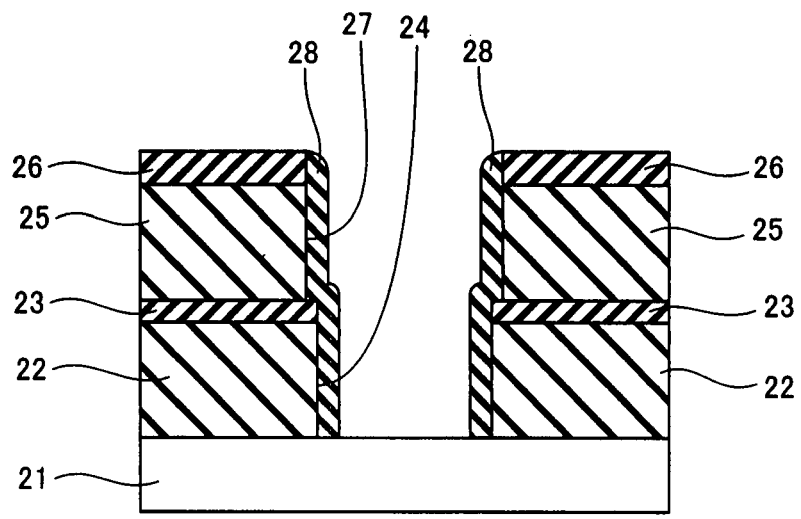
FIG. 20 is a sectional view taken along the line 700-700 in FIG. 19.
Figure 21:
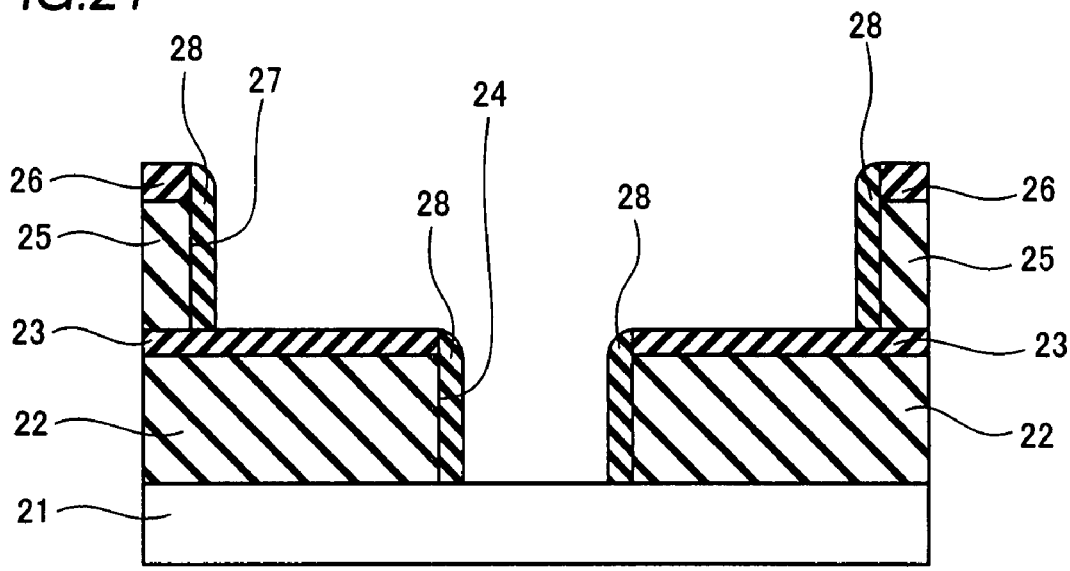
FIG. 21 is a sectional view taken along the line 800-800 in FIG. 19.

As shown in FIGS. 19 to 21, the gas-liquid separation film 28 is anisotropically etched to expose the upper surfaces of the gas-liquid separation films 23 and 26 and the silicon substrate 21. At this time, a portion, located on the inner side surfaces of the via hole 24 and the trench 27, of the gas-liquid separation film 28 having a large vertical thickness with respect to the upper surface of the silicon substrate 21 remains unetched. Thus, the gas-liquid separation film 28 is brought into the form of a side wall arranged only on the inner side surfaces of the via hole 24 and the trench 27.

Figure 22:
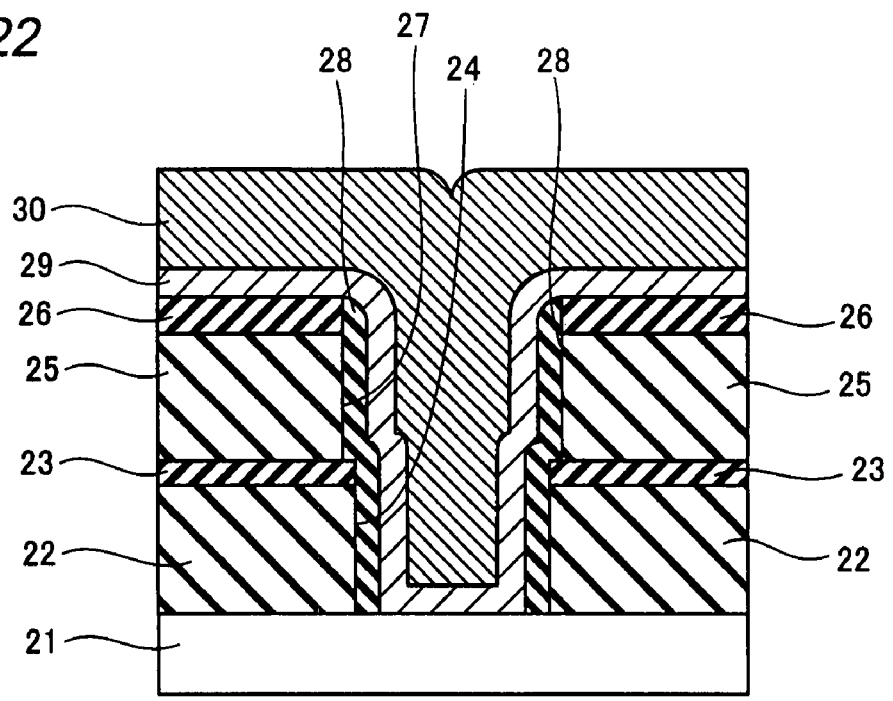
FIG. 22 is a sectional view for illustrating the process of fabricating the semiconductor device according to the second embodiment of the present invention.

As shown in FIG. 22, the barrier metal layer 29 having the shape reflecting those of the via hole 24 and the trench 27 is formed on the overall surface by sputtering. This barrier metal layer 29 is prepared by successively forming the TaN layer having the thickness of about 15 nm and the Ta layer having the thickness of about 15 nm. Thereafter a seed layer (not shown) of Cu for plating is formed on the barrier metal layer 29 by sputtering.

Then, Cu is deposited on the seed layer (not shown) by electroplating. The components of a plating solution employed for this plating step (wet process) are similar to those of the plating solution employed for forming the wiring layer 7 of the semiconductor device according to the aforementioned first embodiment. Thus, the wiring layer 30 of Cu is formed on the seed layer to fill up the via hole 24 and the trench 27.

According to the second embodiment, the gas-liquid separation films 23, 26 and 28 can inhibit the plating solution from penetrating into the interlayer dielectric films 22 and 25 in the aforementioned plating step (wet process). Consequently, the interlayer dielectric films 22 and 25 can be prevented from deterioration resulting from the plating solution penetrating into the same.

The wiring layer 30 and the barrier metal layer 29 are thereafter polished by CMP from above the upper surface of the wiring layer 30, and the gas-liquid separation film 26 is thereafter polished until the thickness thereof reaches about 15 nm. The components of chemical solutions employed in this CMP step (wet process) are similar to those of the chemical solutions employed in the CMP step of the aforementioned first embodiment. Thus, the semiconductor device is implemented in the structure having the wiring layer 30 formed only on the region located inside the via hole 24 and the trench 27 as shown in FIGS. 11 to 13.

According to the second embodiment, the gas-liquid separation films 23, 26 and 28 can inhibit the chemical solutions for CMP from penetrating into the interlayer dielectric films 22 and 25 in the wet process of the aforementioned CMP step. Consequently, the interlayer dielectric films 22 and 25 can be prevented from deterioration resulting from the chemical solutions for CMP penetrating into the same.

Then, the interlayer dielectric films 22 and 25 are recovered from damage caused by the plasma in the aforementioned plasma process. More specifically, the interlayer dielectric films 22 and 25 are annealed in a TMCTS gas atmosphere for recovering the same from deterioration under a temperature condition of about 400° C. According to the second embodiment, TMCTS gas can be introduced into the interlayer dielectric films 22 and 25 through the gas-liquid separation films 23, 26 and 28 at this time. Consequently, the interlayer dielectric films 22 and 25 can be recovered from deterioration with the TMCTS gas.

Third Embodiment

Figure 23:
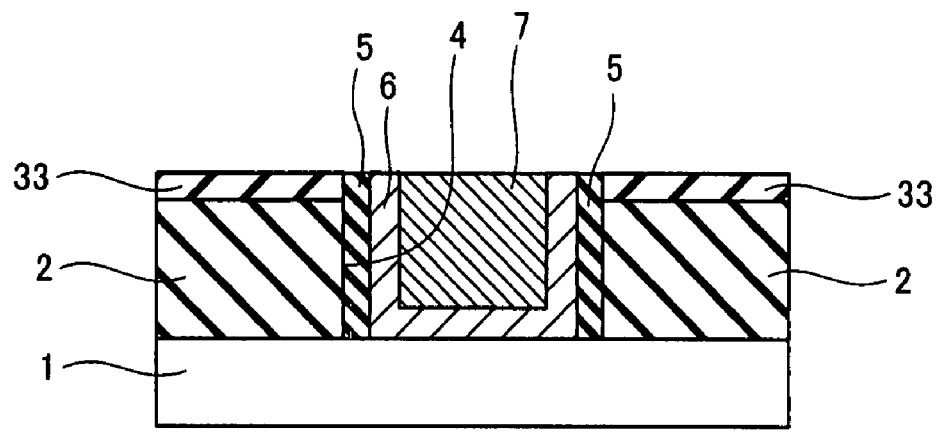
FIG. 23 is a sectional view showing the structure of a semiconductor device according to a third embodiment of the present invention.

Referring to FIG. 23, an $SiO_2$ film 33 is formed on the upper surface of an interlayer dielectric film 2 in a semiconductor device according to a third embodiment of the present invention having a structure similar to that of the first embodiment shown in FIG. 2, in place of the gas-liquid separation film 3. The $SiO_2$ film 33 is set to a thickness capable of inhibiting chemical solutions employed for a wet process from permeating the $SiO_2$ film 33 and reaching the interlayer dielectric film 2. The remaining structure of the semiconductor device according to the third embodiment is similar to that of the semiconductor device according to the aforementioned first embodiment.

According to the third embodiment, effects similar to those of the first embodiment can be attained due to the aforementioned structure. However, the material constituting the $SiO_2$ film 33 formed on the upper surface of the interlayer dielectric film 2 is so hardly permeable by a gas that it is difficult to introduce a prescribed gas for recovering the interlayer dielectric film 2 from deterioration into the interlayer dielectric film 2 from above the upper surface thereof.

Fourth Embodiment

Figure 24:
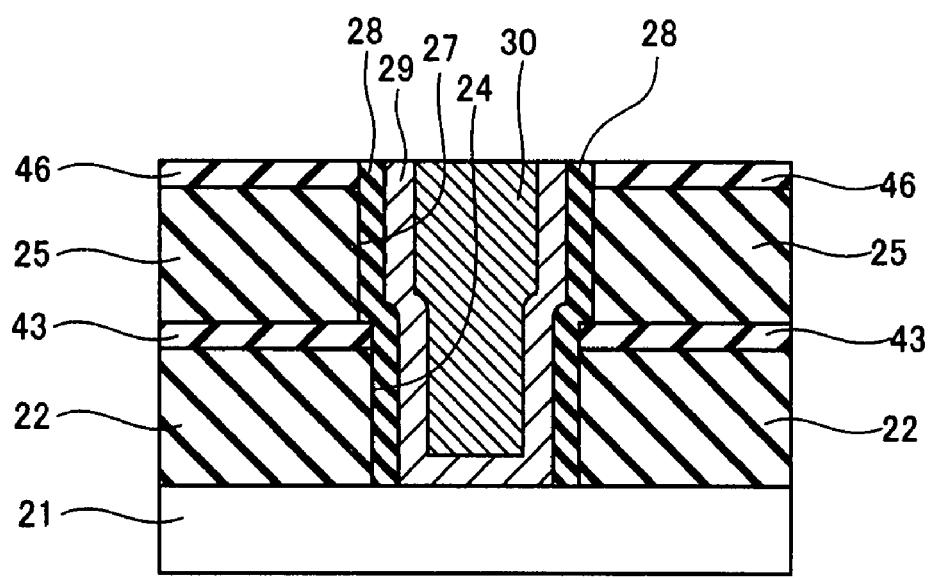
FIG. 24 is a sectional view showing the structure of a semiconductor device according to a fourth embodiment of the present invention.

Referring to FIG. 24, $SiO_2$ films 43 and 46 are formed on the upper surfaces of interlayer dielectric films 22 and 25 respectively in a semiconductor device according to a fourth embodiment of the present invention having a structure similar to that of the second embodiment shown in FIG. 12, in place of the gas-liquid separation films 23 and 26. The $SiO_2$ film 43 is set to a thickness of about 15 nm, while the $SiO_2$ film 46 is set to a thickness capable of inhibiting chemical solutions employed for a wet process from permeating the $SiO_2$ film 46 and reaching the interlayer dielectric film 25. The remaining structure of the semiconductor device according to the fourth embodiment is similar to that of the semiconductor device according to the aforementioned second embodiment.

According to the fourth embodiment, effects similar to those of the second embodiment can be attained due to the aforementioned structure. However, the materials constituting the $SiO_2$ films 43 and 46 formed on the upper surfaces of the interlayer dielectric films 22 and 25 respectively are so hardly permeable by a gas that it is difficult to introduce a prescribed gas for recovering the interlayer dielectric films 22 and 25 from deterioration into the interlayer dielectric films 22 and 25 from above the upper surfaces thereof.

Fifth Embodiment

Figure 25:
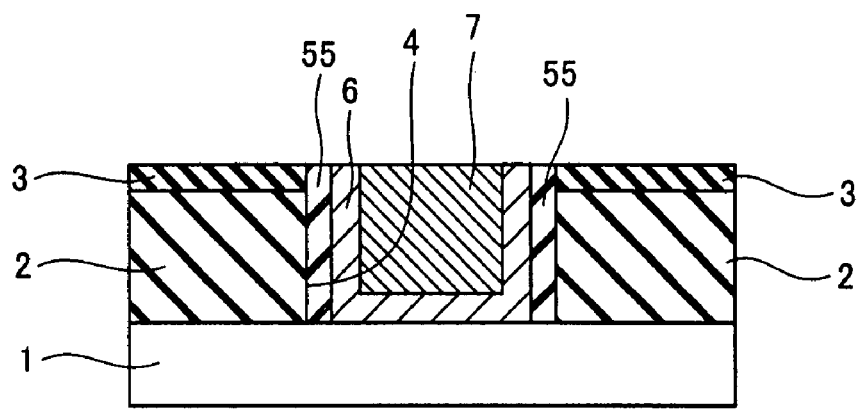
FIG. 25 is a sectional view showing the structure of a semiconductor device according to a fifth embodiment of the present invention.

Referring to FIG. 25, an $SiO_2$ film 55 is formed on the inner side surfaces of a trench 4 in a semiconductor device according to a fifth embodiment of the present invention having a structure similar to that of the first embodiment shown in FIG. 2, in place of the gas-liquid separation film 5. This $SiO_2$ film 55 is set to a thickness capable of inhibiting chemical solutions employed for a wet process from permeating the $SiO_2$ film 55 and reaching an interlayer dielectric film 2. The remaining structure of the semiconductor device according to the fifth embodiment is similar to that of the semiconductor device according to the aforementioned first embodiment.

According to the fifth embodiment, effects similar to those of the first embodiment can be attained due to the aforementioned structure. However, the material constituting the $SiO_2$ film 55 formed on the inner side surfaces of the trench 4 is so hardly permeable by a gas that it is difficult to introduce a prescribed gas for recovering the interlayer dielectric film 2 from deterioration into the interlayer dielectric film 2 from the inner side surfaces of the trench 4.

Sixth Embodiment

Figure 26:
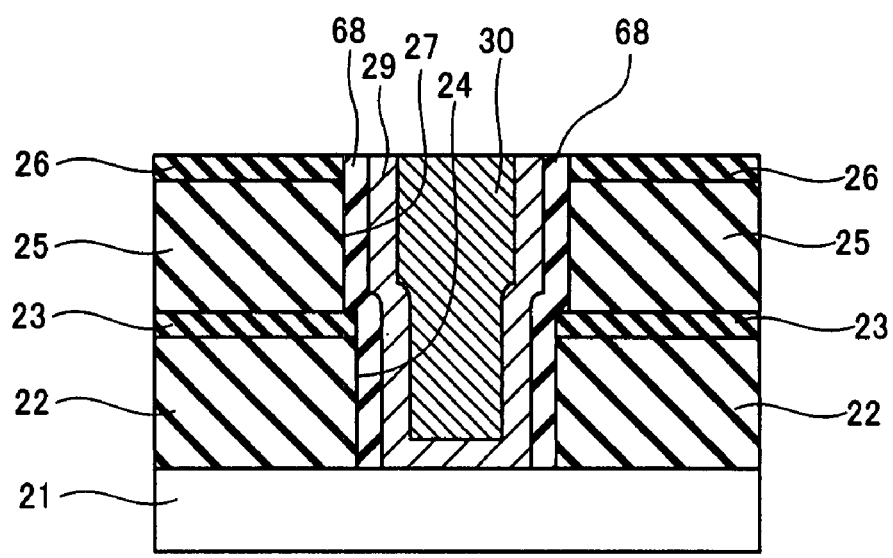
FIG. 26 is a sectional view showing the structure of a semiconductor device according to a sixth embodiment of the present invention.

Referring to FIG. 26, an $SiO_2$ film 68 is formed on the inner side surfaces of a via hole 24 and a trench 27 in a semiconductor device according to a sixth embodiment of the present invention having a structure similar to that of the second embodiment shown in FIG. 12, in place of the gas-liquid separation film 28. This $SiO_2$ film 68 is set to a thickness capable of inhibiting chemical solutions employed for a wet process from permeating the $SiO_2$ film 68 and reaching interlayer dielectric films 22 and 25. The remaining structure of the semiconductor device according to the sixth embodiment is similar to that of the semiconductor device according to the aforementioned second embodiment.

According to the sixth embodiment, effects similar to those of the second embodiment can be attained due to the aforementioned structure. However, the material constituting the $SiO_2$ film 68 formed on the inner side surfaces of the via hole 24 and the trench 27 is so hardly permeable by a gas that it is difficult to introduce a prescribed gas for recovering the interlayer dielectric films 22 and 25 from deterioration into the interlayer dielectric films 22 and 25 from the inner side surfaces of the via hole 24 and the trench 27.

Experiments conducted for confirming the aforementioned effect of preventing the interlayer dielectric film(s) from deterioration resulting from penetration of liquids and the aforementioned effect of recovering the interlayer dielectric film(s) from deterioration with a prescribed gas are now described.

Figure 27:
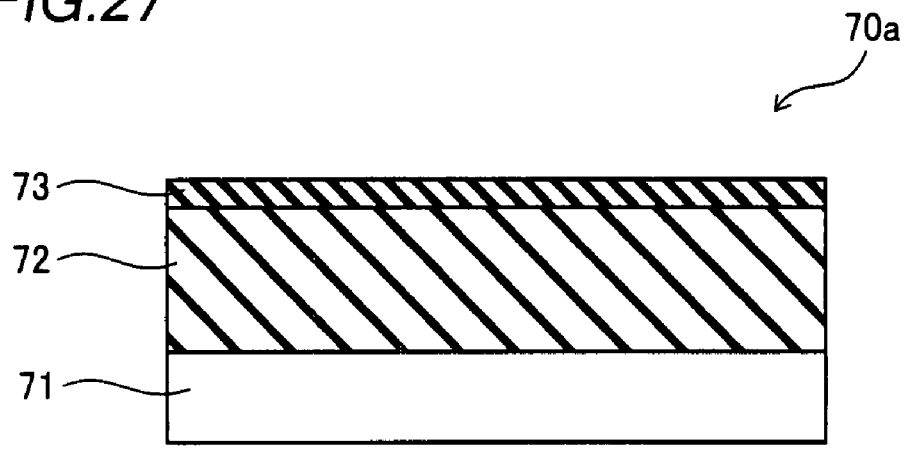
FIGS. 27 and 28 are sectional views showing the structures of samples employed in experiments conducted for confirming effects of the embodiments of the present invention.
Figure 28:
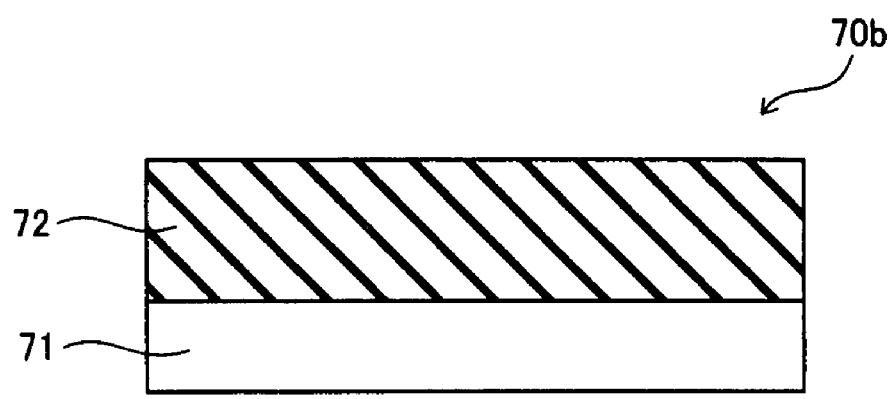

FIG. 27 shows a sample 70a prepared for the experiment conducted for confirming the aforementioned effect of preventing the interlayer dielectric film(s) from deterioration resulting from penetration of liquids. More specifically, a porous $SiO_2$ film 72 and an SiOC film 73 were successively formed on a silicon substrate 71. In this confirmatory experiment, three types of samples 70a were prepared with SiOC films 73 having different thicknesses of 5 nm, 13 nm and 15 nm respectively. In these samples 7a, the $SiO_2$ films 72 and the SiOC films 73 were formed under the same conditions as those for the interlayer dielectric film ($SiO_2$ film) 2 and the gas-liquid separation film (SiOC film) 3 of the semiconductor device according to the aforementioned first embodiment respectively. As comparative example, another sample 70b (see FIG. 28) was prepared in a structure similar to that of the sample 70a shown in FIG. 27, with no SiOC film.

The aforementioned samples 70a and 70b were subjected to FT-IR (Fourier transform infrared spectroscopic analysis). Thereafter the samples 70a and 70b were dipped in a plating solution for 70 seconds, thereafter washed with pure water for 60 seconds, and dried in an $N_2$ atmosphere. The samples 70a and 70b dipped in the plating solution and washed with the pure water were subjected to FT-IR again.

Figure 29:
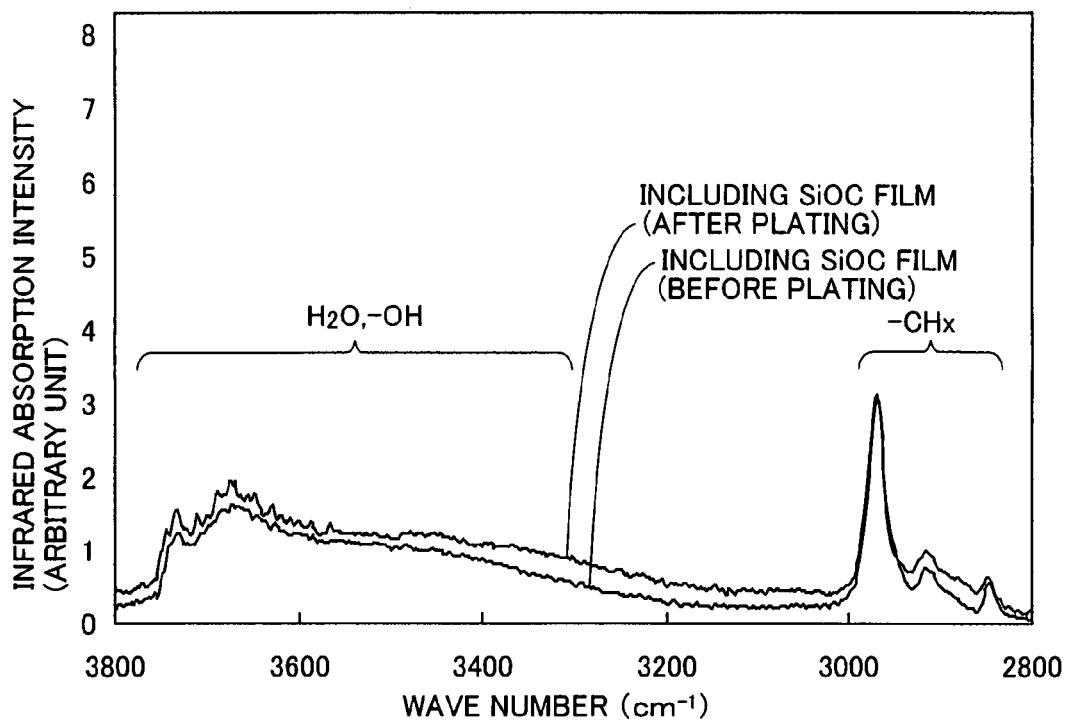
FIGS. 29 and 30 are waveform diagrams showing results of FT-IR measurement before and after dipping in a plating solution and washing with pure water.
Figure 30:
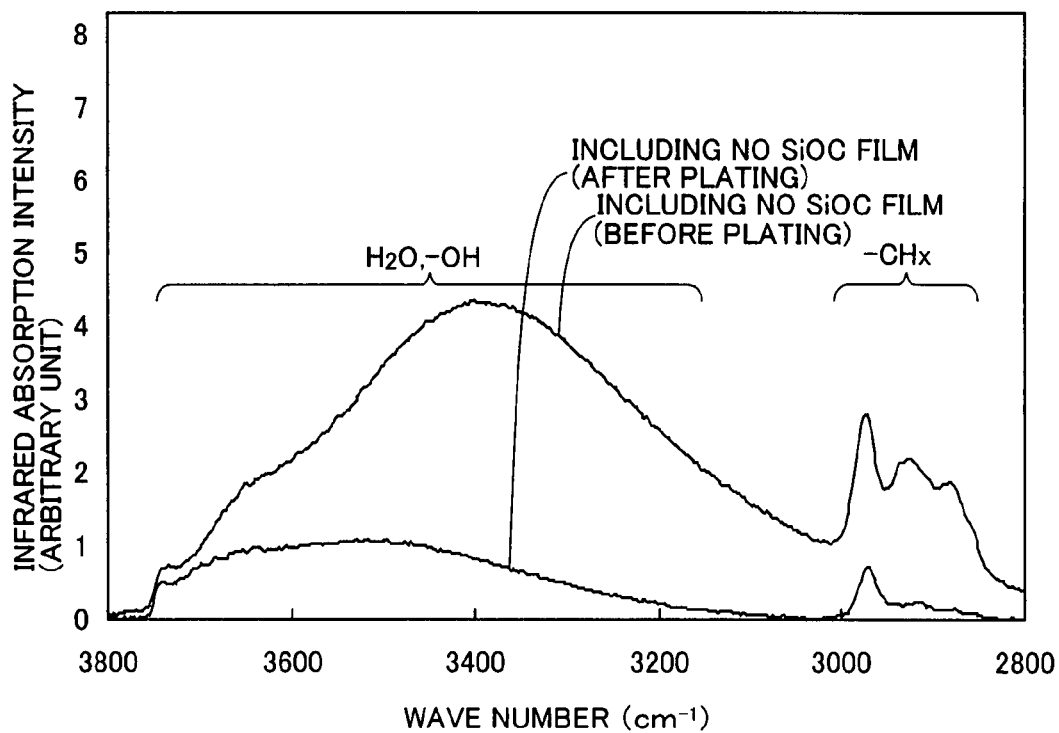

It has been proved that the spectrum of each sample 70a including the SiOC film 73 remained substantially unchanged before and after the aforementioned processing (dipping in the plating solution and washing with the pure water), as shown in FIG. 29. It has also been proved that the spectrum of the sample 70b including no SiOC film changed before and after the aforementioned processing, as shown in FIG. 30. More specifically, it has been proved that the spectrum of $—CH_x$ appearing around 2850 $cm^{-1}$ to 3000 $cm^{-1}$ increased due to the aforementioned processing. This is conceivably because organic chemical solutions contained in the plating solution penetrated into the $SiO_2$ film 72. It has further been proved that the spectra related to OH and $H_2O$ appearing around 3000 $cm^{-1}$ to 3800 $cm^{-1}$ increased due to the aforementioned processing in the sample 70b including no SiOC film. This is conceivably because moisture was incorporated into the $SiO_2$ film 72 in the sample 70b including no SiOC film. In other words, the $SiO_2$ film 72 conceivably lost hydrophobicity due to penetration of the organic chemical solutions contained in the plating solution.

Thus, the SiOC film 73 formed on the $SiO_2$ film 72 conceivably inhibited the chemical solutions from penetrating into the $SiO_2$ film 72 in each sample 70a exhibiting the spectrum substantially unchanged before and after the aforementioned processing. From these results, it has been confirmed that the semiconductor device according to each of the first to sixth embodiments having the gas-liquid separation film(s) (SiOC film(s)) formed on the interlayer dielectric film(s) ($SiO_2$ film(s)) can inhibit the chemical solutions from penetrating into the interlayer dielectric film(s) with the gas-liquid separation film(s) (SiOC film(s)).

In the experiment conducted for confirming the effect of preventing the interlayer dielectric film(s) from deterioration resulting from penetration of liquids, leakage currents of the samples 70a and 70b were measured with a mercury probe before and after the aforementioned dipping in the plating solution and the aforementioned washing with the pure water. In this measurement of the leakage currents, an applied field was set to 1 MV/cm.

Figure 31:
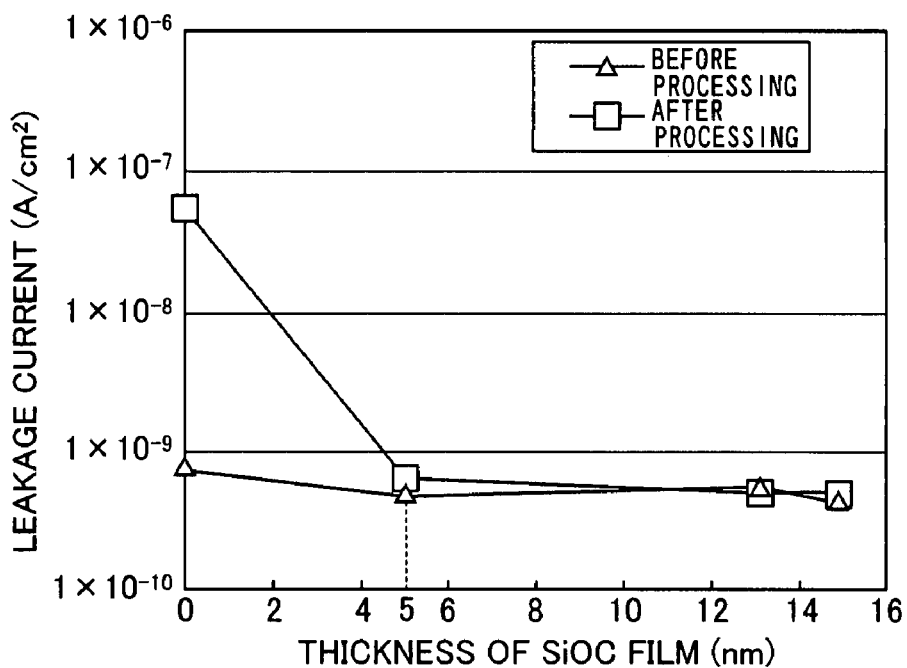
FIG. 31 is a graph showing leakage currents measured before and after dipping in the plating solution and washing with pure water.

Referring to FIG. 31, it has been proved that the leakage current remained substantially unchanged before and after the aforementioned processing (dipping in the plating solution and washing with the pure water) in each sample 70a including the SiOC film 73 having the thickness of at least 5 nm. It has also been proved that the leakage current increased due to the aforementioned processing if the thickness of the SiOC film 73 was smaller than 5 nm. It has further been proved that the leakage current increased by about two digits due to the aforementioned processing in the sample 70b including no SiOC film (thickness of SiOC film: 0 nm). This is conceivably because moisture was incorporated into the $SiO_2$ film 72 losing hydrophobicity due to penetration of the organic chemical solutions contained in the plating solution when the thickness of the SiOC film 73 was smaller than 5 nm. From these results, it can be said that the gas-liquid separation film(s) can inhibit the chemical solutions from penetrating into the interlayer dielectric film(s) in the semiconductor device according to each of the first to sixth embodiments provided with the gas-liquid separation film(s) (SiOC film(s)) having the thickness set to about 15 nm.

In the experiment conducted for confirming the effect of preventing the interlayer dielectric film(s) from deterioration resulting from penetration of liquids, dielectric constants of the samples 70a and 70b were further measured before and after the aforementioned dipping in the plating solution and the aforementioned washing with the pure water.

Figure 32:
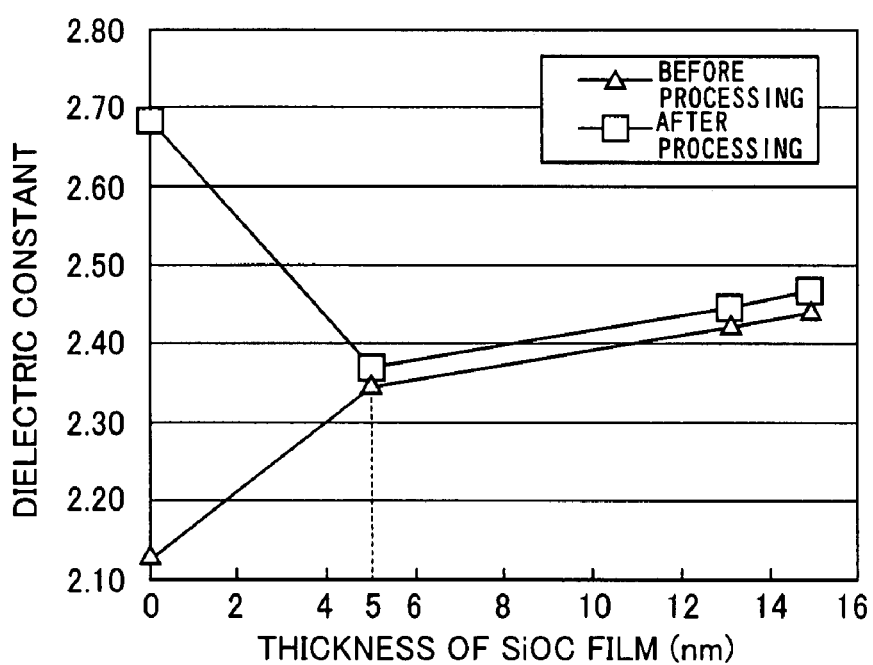
FIG. 32 is a graph showing dielectric constants measured before and after dipping in the plating solution and washing with pure water.

Referring to FIG. 32, it has been proved that the dielectric constant remained substantially unchanged before and after the aforementioned processing (dipping in the plating solution and washing with the pure water) in each sample 70a including the SiOC film 73 having the thickness of at least 5 nm. It has also been proved that the dielectric constant increased due to the aforementioned processing if the thickness of the SiOC film 73 was smaller than 5 nm. It has further been proved that the dielectric constant increased by about 0.6 due to the aforementioned processing in the sample 70b including no SiOC film. This is conceivably because moisture was incorporated into the $SiO_2$ film 72 losing hydrophobicity due to penetration of the organic chemical solutions contained in the plating solution when the thickness of the SiOC film 73 was smaller than 5 nm. From these results, it can be said that the gas-liquid separation film(s) can inhibit the chemical solutions from penetrating into the interlayer dielectric film(s) in the semiconductor device according to each of the first to sixth embodiments provided with the gas-liquid separation film(s) (SiOC film(s)) having the thickness set to about 15 nm. The dielectric constant increases in proportion to the ratio of the thickness of the SiOC film 73 to the total thickness of the SiO$_2$ film 72 and the SiOC film 73.

In the experiment conducted for confirming the effect of preventing the interlayer dielectric film(s) from deterioration resulting from penetration of liquids, contact angles of the SiOC film (gas-liquid separation film) 73 with respect to the pure water and the plating solution were measured in each sample 70a.

Figure 33:
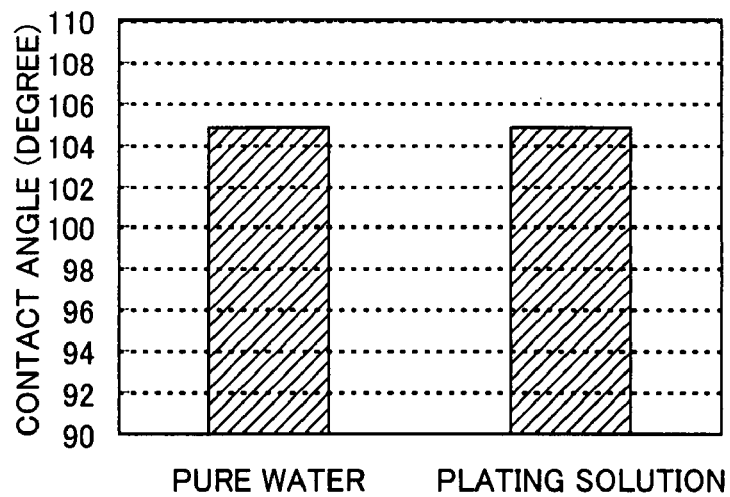
FIG. 33 is a graph showing contact angles of an SiOC film (gas-liquid separation film) with respect to pure water and the plating solution.

Referring to FIG. 33, the contact angles of the SiOC film (gas-liquid separation film) 73 with respect to the pure water and the plating solution were in excess of 90° respectively. Therefore, it can be said that the gas-liquid separation film(s) can inhibit the chemical solutions from penetrating into the interlayer dielectric film(s) in the semiconductor device according to each of the first to sixth embodiments employing the SiOC film(s) as the gas-liquid separation film(s).

In the aforementioned experiment conducted for confirming the effect of recovering the interlayer dielectric film(s) from deterioration with a prescribed gas, two types of samples 70a similar to that shown in FIG. 27 were prepared with SiOC films 73 having different thicknesses of 15 nm and 25 nm respectively. In this confirmatory experiment, an SiO$_2$ film 72 was formed on a silicon substrate 71 and thereafter deteriorated through exposure to plasma in each sample 70a. The SiO$_2$ film 72 was deteriorated through a capacitivity coupled plasma CVD apparatus (Dragon 2300 by ASM). At this time, He gas was employed as a reaction gas with a flow rate set to about 240 sccm. Further, a chamber pressure, the substrate temperature, power applied to electrodes on which no substrate was set, a power frequency and an interelectrode distance were set to about 50 Pa, about 350° C., about 200 W, about 27.12 MHz and about 20 mm respectively. As comparative example, a sample 70b similar to that shown in FIG. 28 was prepared and an SiO$_2$ film 72 was thereafter deteriorated through exposure to plasma.

The aforementioned samples 70a and 70b were subjected to FT-IR. Thereafter the samples 70a and 70b were annealed in a TMCTS gas atmosphere under a temperature condition of about 400° C., and subjected to FT-IR again.

Figure 34:
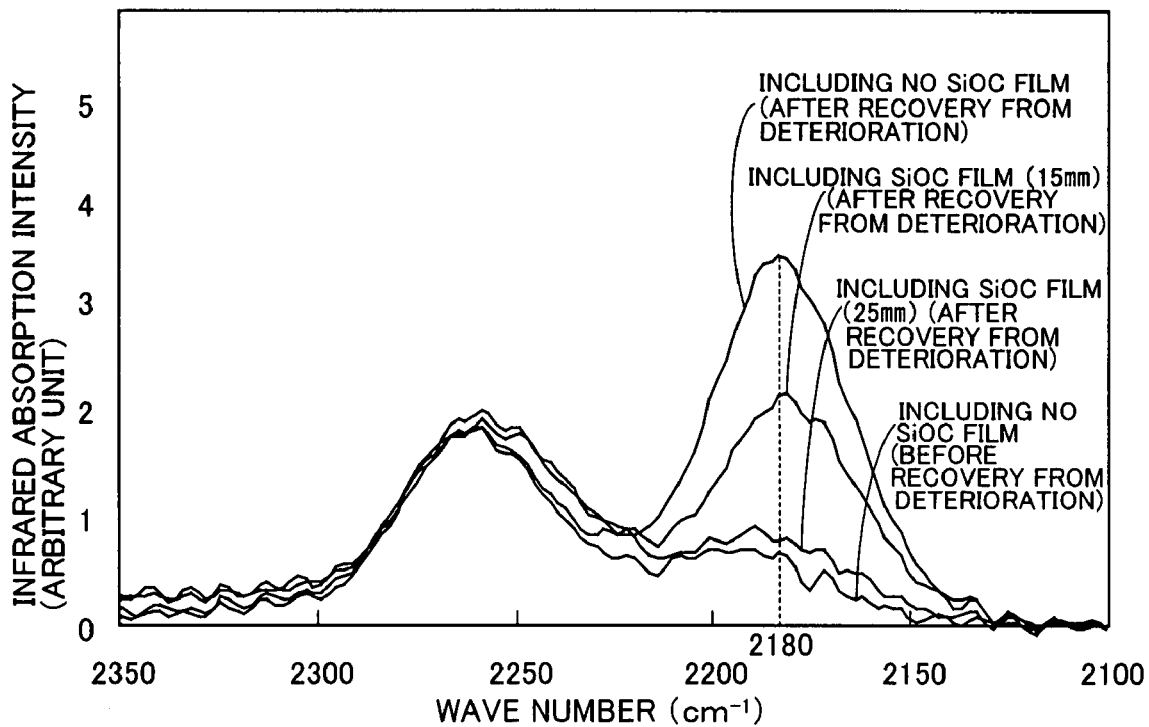
FIG. 34 is a waveform diagram showing results of FT-IR measurement conducted before and after annealing in a TMCT gas atmosphere.

Referring to FIG. 34, it has been proved that a spectrum of Si-H appearing around 2180 cm$^{-1}$ increased due to the aforementioned annealing in the sample 70b including no SiOC film. In other words, it has been proved that TMCTS adhered to the SiO$_2$ film 72 due to the aforementioned annealing in the sample 70b including no SiOC film.

It has also been proved that a spectrum of Si-H appearing around 2180 cm$^{-1}$ increased due to the aforementioned annealing in the sample 70a including the SiOC film 73 having the thickness of 15 nm. It has further been proved that a spectrum of Si—H appearing around 2180 cm$^{-1}$ remained substantially unchanged regardless of the aforementioned annealing in the sample 70a including the SiOC film 73 having the thickness of 25 nm, as compared with the sample 70b, not yet annealed, including no SiOC film.

Thus, TMCTS gas conceivably penetrated the SiOC film 73 to cause adhesion of TMCTS to the SiO$_2$ film 72 in the sample 70a including the SiOC film 73 having the thickness set to 15 nm. On the other hand, the TMCTS gas conceivably hardly penetrated the SiOC film 73 to hardly cause adhesion of TMCTS to the SiO$_2$ film 72 in the sample 70a including the SiOC film 73 having the thickness set to 25 nm. In other words, it can be said that the TMCTS gas hardly penetrates the SiOC film 73 when the thickness of this SiOC film 73 is larger than 15 nm. From these results, it has been confirmed that the interlayer dielectric film(s) can be recovered from deterioration with TMCTS gas penetrating into the gas-liquid separation film(s) (SiOC film(s)) in the semiconductor device according to each of the first to sixth embodiments including the gas-liquid separation film(s) (SiOC film(s)) having the thickness set to about 15 nm.

It has been proved from the aforementioned experimental results that the thickness of the gas-liquid separation film(s) (SiOC film(s)) is preferably set to at least about 5 nm and not more than about 15 nm.

Although the present invention has been described and illustrated in detail, it is clearly understood that the same is by way of illustration and example only and is not to be taken by way of limitation, the spirit and scope of the present invention being limited only by the terms of the appended claims.

For example, while the gas-liquid separation film(s) is prepared from SiOC in each of the aforementioned first to sixth embodiments, the present invention is not restricted to this but the gas-liquid separation film(s) may alternatively be prepared from a material other than SiOC so far as the material is easily permeable by a gas.

While the wiring layer is formed on the region located inside the opening of the interlayer dielectric film in each of the aforementioned first to sixth embodiments, the present invention is not restricted to this but the wiring layer may alternatively be formed on a region other than that located inside the opening of the interlayer dielectric film. Further alternatively, the wiring layer may be formed on an interlayer dielectric film having no opening.

While the interlayer dielectric film having the opening is formed on the silicon substrate and the wiring layer is connected to the silicon substrate through the opening in each of the aforementioned first to sixth embodiments, the present invention is not restricted to this but the interlayer dielectric film having the opening may alternatively be formed on a conductive layer formed on the silicon substrate so that the wiring layer is connected to the conductive layer through the opening.

While the porous interlayer dielectric film(s) is employed in each of the aforementioned first to sixth embodiments, the present invention is not restricted to this but an unporous interlayer dielectric film(s) may alternatively be employed.

While TMCTS gas is employed as the gas for recovering the interlayer dielectric film(s) from deterioration in each of the aforementioned first to sixth embodiments, the present invention is not restricted to this but HMDS (hexamethyldisilazane) gas or siloxane gas having a molecular weight of 100 to 1000 may alternatively be employed in place of the TMCTS gas.

While the silicon substrate having the transistor is employed in each of the aforementioned first to sixth embodiments, the present invention is not restricted to this but a multilayer structure including a silicon substrate having a transistor and an insulating film or the like formed thereon may alternatively be employed in place of the silicon substrate having the transistor.

What is claimed is:
1. A semiconductor device comprising:
a first insulating film formed on a substrate, wherein a trench is provided in the first insulating film to expose a surface of the substrate;
a first gas-liquid separation film, composed of an insulating film hardly permeable by a liquid and easily permeable by a gas, formed on the upper surface of said first insulating film and inside side surfaces of said first insulating film facing the trench.

2. The semiconductor device according to claim 1, further comprising a wiring layer formed on at least said part of the surface of said first insulating film.

3. The semiconductor device according to claim 2, wherein
said first insulating film has a first opening for communicating with said part of the surface of said substrate,
said first gas-liquid separation film is formed at least either on the inner surface of said first opening of said first insulating film or on the upper surface of said first insulating film opposite to said substrate, and
said wiring layer is formed inside said first opening of said first insulating film.

4. The semiconductor device according to claim 3, wherein said first gas-liquid separation film is formed on both of the inner surface of said first opening of said first insulating film and the upper surface of said first insulating film opposite to said substrate.

5. The semiconductor device according to claim 3, wherein said first gas-liquid separation film is formed not on the inner surface of said first opening of said first insulating film but on the upper surface of said first insulating film opposite to said substrate.

6. The semiconductor device according to claim 3, wherein said first gas-liquid separation film is formed not on the upper surface of said first insulating film opposite to said substrate but on the inner surface of said first opening of said first insulating film.

7. The semiconductor device according to claim 3, further comprising a barrier metal layer arranged between said wiring layer and said substrate.

8. The semiconductor device according to claim 3, further comprising:
a second insulating film formed on said first insulating film, and
a second gas-liquid separation film, formed on at least a part of the surface of said second insulating film, composed of a material hardly permeable by a liquid and easily permeable by a gas, wherein
said second insulating film has a second opening connected to said first opening of said first insulating film,
said first gas-liquid separation film and said second gas-liquid separation film are formed at least either on the inner surfaces of said first and second openings or on the upper surfaces of
said first and second insulating films opposite to said substrate, and
said wiring layer is formed inside said first and second openings.

9. The semiconductor device according to claim 8, wherein
said first gas-liquid separation film and said second gas-liquid separation film are formed on both of the inner surfaces of said first and second openings and the upper surfaces of said first and second insulating films opposite to said substrate.

10. The semiconductor device according to claim 1, wherein
said first gas-liquid separation film includes a gas-liquid separation film composed of SiOC.

11. The semiconductor device according to claim 10, wherein
said first gas-liquid separation film has a thickness of at least 5 nm and not more than 15 nm.

12. The semiconductor device according to claim 1, wherein
said first insulating film includes a porous insulating film.

13. The semiconductor device according to claim 1,
wherein the first gas-liquid separation film is composed of a material hardly permeable by a liquid and easily permeable by tetramethylcyclotetrasiloxane, and tetramethylcyclotetrasiloxane is introduced into said first insulating film.

14. The semiconductor device according to claim 1, further comprising:
a barrier metal layer formed on both the substrate and the gas-liquid separation film inside the trench.

* * * * *